US011425829B2

(12) United States Patent
Zheng et al.

(10) Patent No.: US 11,425,829 B2
(45) Date of Patent: *Aug. 23, 2022

(54) HEAD-MOUNTED DISPLAY APPARATUS

(71) Applicant: SHENZHEN KUKU TECHNOLOGY CO., LTD., Guangdong (CN)

(72) Inventors: Xiaolin Zheng, Guangdong (CN); Jun Liu, Guangdong (CN); Hao Chen, Guangdong (CN)

(73) Assignee: SHENZHEN KUKU TECHNOLOGY CO., LTD., Shenzhen (CN)

( * ) Notice: Subject to any disclaimer, the term of this patent is extended or adjusted under 35 U.S.C. 154(b) by 877 days.

This patent is subject to a terminal disclaimer.

(21) Appl. No.: 16/254,544

(22) Filed: Jan. 22, 2019

(65) Prior Publication Data

US 2019/0159354 A1    May 23, 2019

Related U.S. Application Data

(63) Continuation of application No. PCT/CN2016/107250, filed on Nov. 25, 2016.

(30) Foreign Application Priority Data

Aug. 3, 2016    (CN) .......................... 201610629871.9

(51) Int. Cl.
*H05K 5/02* (2006.01)
*G02B 7/12* (2021.01)
(Continued)

(52) U.S. Cl.
CPC ............. *H05K 5/0217* (2013.01); *A42B 1/22* (2013.01); *A42B 1/24* (2013.01); *G02B 7/023* (2013.01);
(Continued)

(58) Field of Classification Search
CPC .......... G02B 7/02; G02B 7/023; G02B 7/021; G02B 7/12; G02B 7/04; G02B 27/01;
(Continued)

(56) References Cited

U.S. PATENT DOCUMENTS 11,092,772 B2 *  8/2021  Zheng ................... G02B 7/021
2016/0349519 A1 * 12/2016  Yang .................. G02B 27/0176

FOREIGN PATENT DOCUMENTS

CN         101840068 A    9/2010
CN         204679715 U    9/2015
(Continued)

OTHER PUBLICATIONS

International Search Report of PCT Patent Application No. PCT/CN2016/107250 dated Apr. 21, 2017.

*Primary Examiner* — Jie Lei

(57) ABSTRACT

The invention discloses a head-mounted display apparatus. The head-mounted display comprises a headband module and a head-mounted display module, wherein the head-mounted display comprises an optical module, the headband comprises a connecting structure connected with the head-mounted display housing so as to adjust the wearing angle of the head-mounted display module; The optical module comprises a module housing, a left lens barrel mechanism, a right lens barrel mechanism, a left sight distance adjusting mechanism and a left pupillary distance adjusting mechanism for adjusting the sight distance and pupillary distance of the left lens barrel mechanism, a right sight distance adjusting mechanism and a right pupillary distance adjusting mechanism for adjusting the sight distance and pupillary distance of the right lens barrel mechanism. The head-mounted display can separately adjust the sight distance and pupillary distance of the left and right lens barrel mechanism, as well as the wearing angle.

9 Claims, 8 Drawing Sheets

(51) Int. Cl.
  *G02B 7/02* (2021.01)
  *H05K 5/00* (2006.01)
  *A42B 1/24* (2021.01)
  *A42B 1/22* (2006.01)
  *G02B 27/01* (2006.01)

(52) U.S. Cl.
  CPC .............. *G02B 7/12* (2013.01); *G02B 27/01* (2013.01); *H05K 5/0017* (2013.01)

(58) Field of Classification Search
  CPC .............. G02B 27/017; G02B 27/0176; G02B 27/0172; G02B 27/0179; G02B 27/0101; G02B 27/0103; G02B 2027/0159; G02B 2027/011; G02B 2027/0154; G02B 2027/0132; G02B 2027/0178; H05K 5/02; H05K 5/0217; H05K 5/0017; H05K 5/00; A42B 1/24; A42B 1/22
  USPC .................. 359/815, 13, 630–633, 480, 481; 345/7–9; 348/115, 116
  See application file for complete search history.

(56) References Cited

FOREIGN PATENT DOCUMENTS

| | | | |
|---|---|---|---|
| CN | 104977718 | A | 10/2015 |
| CN | 204832684 | U | 12/2015 |
| CN | 204903862 | U | 12/2015 |
| CN | 206074904 | U | 4/2017 |
| WO | 2015168191 | A1 | 11/2015 |

* cited by examiner 8A           8B

HEAD-MOUNTED DISPLAY APPARATUS

CROSS REFERENCE TO RELATED APPLICATIONS

The present application is a Continuation Application of PCT Application No. PCT/CN2016/107250 filed on Nov. 25, 2016, which claims the benefit of Chinese Patent Application No. 201610629871.9 filed on Aug. 3, 2016. All the above are hereby incorporated by reference.

TECHNICAL FIELD

The invention relates to the field of display apparatus, in particular to the head-mounted display apparatus.

BACKGROUND ART

The existing head-mounted display apparatus comprises a head-mounted display module for displaying optical images and a headband module connected with the head-mounted display module, and can be worn on user's head, wherein the head-mounted display module is internally provided with an optical module. The existing optical module comprises a display screen, a left lens barrel assembly and a right lens barrel assembly arranged in front of the display screen, a sight distance adjusting assembly and a pupillary distance adjusting mechanism. The existing sight distance adjusting assembly can only synchronously adjust the sight distance of the left lens barrel assembly and the right lens barrel assembly. For users with different diopters of the left eye and the right eye, synchronously adjusting the sight distance of the left lens barrel assembly and the right lens barrel assembly will cause the image definition seen by the left eye and the right eye to be different when the user views the images through the optical module, thus affecting the visual experience. The existing pupillary distance adjusting mechanism can only synchronously adjust the distance between the left lens barrel assembly and the right lens barrel assembly, and cannot independently adjust the positions of the left lens barrel assembly and the right lens barrel assembly according to the pupillary distance of the user's eyes. In the process of performing the pupillary distance adjustment, the left lens barrel assembly and the right lens barrel assembly move relative to the effective display image of the display screen, affecting the display effect of the display images of the left lens barrel assembly and the right lens barrel assembly. The existing headband module usually comprises a headband body and an adjuster for adjusting the headband body, the adjuster mostly adopts the form of buckle, belt latch or Velcro. Because the display module has a certain weight, users need to hold the display module with one hand and adjust the adjuster with the other hand, the process of adjusting the tightness of the headband body is extremely inconvenient. In addition, the display module and the headband module in the existing head-mounted display apparatus are fixedly connected, the wearing angle of the display module cannot be adjusted independently, making users feel uncomfortable when wearing the head-mounted display apparatus.

SUMMARY OF PRESENT INVENTION

The technical problem to be solved by the invention is to provide a head-mounted display apparatus, aiming at the defect that the wearing angle of the head-mounted display module cannot be adjusted independently in the existing head-mounted display, and the sight distance adjusting mechanism and the pupillary distance adjusting mechanism in the optical module can only synchronously adjust the left lens barrel assembly and the right lens barrel assembly.

The technical solution adopted by the present invention to solve the technical problem thereof is: A head-mounted display apparatus, comprising a headband module and a head-mounted display module connected with the headband module, wherein the head-mounted display module comprises a head-mounted display housing, and an optical module disposed within the head-mounted display housing, characterized in that the headband module comprises a connecting structure connected with the head-mounted display housing so as to adjust the wearing angle of the head-mounted display module; The optical module comprises a module housing, a left lens barrel mechanism, a right lens barrel mechanism, a left sight distance adjusting mechanism, a right sight distance adjusting mechanism, a left pupillary distance adjusting mechanism and a right pupillary distance adjusting mechanism which are arranged in the module housing; The left lens barrel mechanism comprises a left lens barrel assembly and a left display screen assembly sleeved behind the left lens barrel assembly, wherein the left display screen assembly comprises a left display screen and a left screen bracket for mounting the left display screen; The right lens barrel mechanism comprises a right lens barrel assembly and a right display screen assembly sleeved behind the right lens barrel assembly, wherein the right display screen assembly comprises a right display screen and a right screen bracket for mounting the right display screen. The left sight distance adjusting mechanism is arranged inside the module housing and connected with the left display screen assembly for adjusting the distance between the left display screen and the left lens barrel assembly; The right sight distance adjusting mechanism is arranged inside the module housing and connected with the right display screen assembly for adjusting the distance between the right display screen and the right lens barrel assembly. The left pupillary distance adjusting mechanism is connected with the left lens barrel mechanism for driving the left lens barrel mechanism to move left and right; the right pupillary distance adjusting mechanism is connected with the right lens barrel mechanism for driving the right lens barrel mechanism to move left and right.

Preferably, the left sight distance adjustment mechanism comprises a left adjustment button, a left driven synchronous gear, a first left synchronous screw, a second left synchronous screw, a third left synchronous screw, a left tension wheel, a left synchronous belt and a left sight distance pushing bracket; the left sight distance pushing bracket is connected with the left screen bracket; the left sight distance pushing bracket is arranged on the first left synchronous screw, the second left synchronous screw and the third left synchronous screw; The left adjustment button, left driven synchronous gear, first left synchronous screw, second left synchronous screw, third left synchronous screw, left tension wheel and the left synchronous belt are matched, so that the left sight distance pushing bracket drives the left screen bracket to move back and forth;

The right sight distance adjustment mechanism comprises a right adjustment button, a right driven synchronous gear, a first right synchronous screw, a second right synchronous screw, a third right synchronous screw, a right tension wheel, a right synchronous belt and a right sight distance pushing bracket; the right sight distance pushing bracket is connected with the right screen bracket; the right sight distance pushing bracket is arranged on the first right synchronous screw, the second right synchronous screw and the third right synchronous screw; The right adjustment button, right driven synchronous gear, first right synchronous screw, second right synchronous screw, third right synchronous screw, right tension wheel and the right synchronous belt are matched, so that the right sight distance pushing bracket drives the right screen bracket to move back and forth;

Preferably, the left adjustment button comprises a left rotation control and a left driving gear which are integrally formed; The first left synchronous screw comprises a first left driven gear and a first left screw which are integrally formed; The second left synchronous screw comprises a second left driven gear and a second left screw which are integrally formed; The third left synchronous screw comprises a third left driven gear and a third left screw which are integrally formed; The left sight distance pushing bracket comprises a left bracket body, a first left screw hole, a second left screw hole, a third left screw hole and a left bracket connecting part arranged on the left bracket body; The left driving gear, left tension wheel, left driven synchronous gear, first left driven gear, second left driven gear and the third left driven gear are matched with the left synchronous belt to realize synchronous transmission; The first left screw is matched with the first left screw hole, the second left screw is matched with the second left screw hole, and the third left screw is matched with the third left screw hole, to move the left bracket body back and forth;

The right adjustment button comprises a right rotation control and a right driving gear which are integrally formed; The first right synchronous screw comprises a first right driven gear and a first right screw which are integrally formed; The second right synchronous screw comprises a second right driven gear and a second right screw which are integrally formed; The third right synchronous screw comprises a third right driven gear and a third right screw which are integrally formed; The right sight distance pushing bracket comprises a right bracket body, a first right screw hole, a second right screw hole, a third right screw hole and a right bracket connecting part arranged on the right bracket body; The right driving gear, right tension wheel, right driven synchronous gear, first right driven gear, second right driven gear and the third right driven gear are matched with the right synchronous belt to realize synchronous transmission; The first right screw is matched with the first right screw hole, the second right screw is matched with the second right screw hole, and the third right screw is matched with the third right screw hole, to move the right bracket body back and forth.

Preferably, the left lens barrel assembly comprises a left lens barrel housing and a left lens assembly arranged in the left lens barrel housing, and the left lens barrel housing is provided with at least one left connecting hole; The left screen bracket is provided with at least one left sliding groove arranged along the front-back direction; The left lens barrel mechanism also comprises a left connecting pin which passes through the left sliding groove and is installed on the left connecting hole;

The right lens barrel assembly comprises a right lens barrel housing and a right lens assembly arranged in the right lens barrel housing, and the right lens barrel housing is provided with at least one right connecting hole; The right screen bracket is provided with at least one right sliding groove arranged along the front-back direction; The right lens barrel mechanism also comprises a right connecting pin which passes through the right sliding groove and is installed on the right connecting hole;

Preferably, the left pupillary distance adjusting mechanism comprises a left pupillary distance guide shaft, a left lens barrel connecting piece, a left pushing piece and a left push button; The left pupillary distance guide shaft is installed on the module housing; the left lens barrel connecting piece is arranged on the left pupillary distance guide shaft and connected with the left lens barrel assembly; the left pushing piece is arranged on the left pupillary distance guide shaft and drives the left lens barrel connecting piece to move along the left pupillary distance guide shaft; the left push button is arranged on the left pushing piece and is used for controlling the left pushing piece to move along the left pupillary distance guide shaft;

The right pupillary distance adjusting mechanism comprises a right pupillary distance guide shaft, a right lens barrel connecting piece, a right pushing piece and a right push button; The right pupillary distance guide shaft is installed on the module housing; the right lens barrel connecting piece is arranged on the right pupillary distance guide shaft and connected with the right lens barrel assembly; the right pushing piece is arranged on the right pupillary distance guide shaft and drives the right lens barrel connecting piece to move along the right pupillary distance guide shaft; the right push button is arranged on the right pushing piece and is used for controlling the right pushing piece to move along the right pupillary distance guide shaft.

Preferably, the left lens barrel connecting piece comprises a left lens barrel connecting part and a left guide shaft connecting part which are integrally formed, the left lens barrel connecting part is provided with a left guide hole for the left lens barrel assembly to pass through, and the left guide shaft connecting part is provided with a left guide hole for the left pupillary distance guide shaft to pass through; The left push button comprises a left pushing part and left extension convex parts which are integrally formed; the left pushing piece is provided with a left groove matched with the left extension convex parts, and a left pushing insertion hole for the left pupillary distance guide shaft to pass through;

The right lens barrel connecting piece comprises a right lens barrel connecting part and a right guide shaft connecting part which are integrally formed, the right lens barrel connecting part is provided with a right guide hole for the right lens barrel assembly to pass through, and the right guide shaft connecting part is provided with a right guide hole for the right pupillary distance guide shaft to pass through; The right push button comprises a right pushing part and right extension convex parts which are integrally formed; the right pushing piece is provided with a right groove matched with the right extension convex parts, and a right pushing insertion hole for the right pupillary distance guide shaft to pass through.

Preferably, the left pupillary distance adjusting mechanism further comprises a left push limiting assembly; The left push limiting assembly comprises a left pupillary distance sliding limiting piece arranged inside the module housing, and the left pupillary distance sliding limiting piece is matched with the module housing to form a left sliding space for the left pushing piece to be inserted; the left pupillary distance sliding limiting piece on the inner side of the sliding space or one side of the module housing is provided with a left sliding gear rack; the part of the left sliding space where the left pushing piece inserted is provided with a left pushing rack matched with the left sliding gear rack;

The right pupillary distance adjusting mechanism further comprises a right push limiting assembly; The right push limiting assembly comprises a right pupillary distance sliding limiting piece arranged inside the module housing, and the right pupillary distance sliding limiting piece is matched with the module housing to form a right sliding space for the right pushing piece to be inserted; the right pupillary distance sliding limiting piece on the inner side of the sliding space or one side of the module housing is provided with a right sliding gear rack; the part of the right sliding space where the right pushing piece inserted is provided with a right pushing rack matched with the right sliding gear rack.

Preferably, the headband module comprises a headband body, a front housing, a rear housing, an elastic adjustment component, a control locking component and a connecting structure; the front housing and the rear housing are matched to form an accommodating space; The elastic adjusting component is arranged in the accommodating space and connected with the headband body for adjusting tightness of the headband body; the control locking component is arranged in the accommodating space and extends out of the front housing and the rear housing, and is connected with the elastic adjustment component for controlling the elastic adjustment component to adjust the tightness of the headband body;

The connecting structure comprises a first rotating shaft connecting piece, a second rotating shaft connecting piece and a third rotating shaft connecting piece; The first rotating shaft connecting piece and the second rotating shaft connecting piece, the second rotating shaft connecting piece and the third rotating shaft connecting piece are respectively rotatably connected through a rotating shaft connecting assembly; One end of the first rotating shaft connecting piece extends into the accommodating space and is fixedly connected with the head-mounted front housing or the rear housing.

Preferably,the elastic adjustment component comprises a positioning column disposed inside the head-mounted rear housing and in contact with the rear housing, a first headband connector and a second headband connector respectively disposed at both ends of the headband body, and a gear piece sleeved on the positioning column; the first headband connector and the second headband connector are sleeved on the positioning column and move towards or away from each other under the drive of the gear piece;

The control locking component comprises a limit latch arranged on the head-mounted front housing, a locking adjustment button sleeved on the positioning column, and the gear piece; The gear piece comprises the gear part and a gripper integrally formed with the gear part; the gear part is meshed with the first rack and the second rack through the locking adjustment button; The gripper is matched with the locking adjustment button and the limit latch to control the elastic adjustment component to adjust the tightness of the headband body.

Preferably, the rotating shaft connecting assembly comprises two first connecting holes oppositely arranged on the second rotating shaft connecting piece, a second connecting hole arranged on the first rotating shaft connecting piece or the third rotating shaft connecting piece, and a rotating shaft for connecting the two first connecting holes and the second connecting hole; The second connecting hole is positioned between the two first connecting holes, and a damping structure is arranged between the second connecting hole and the rotating shaft;

The rotating shaft comprises two first metal rotating shafts, wherein the first metal rotating shaft comprises a supporting part, a fastening part disposed at one end of the supporting part, and a rotating part sleeved on the supporting part; the damping structure is arranged between the rotating part and the supporting part; the fastening part is disposed in the first connecting hole and interference fit with the first connecting hole, and the rotating part is disposed in the second connecting hole and interference fit with the second connecting hole;

Or, the rotating shaft comprises a second metal rotating shaft, wherein the second metal rotating shaft comprises a supporting part, two fastening parts disposed at two ends of the supporting part, and a rotating part sleeved on the supporting part; the damping structure is arranged between the rotating part and the supporting part; the fastening part is disposed in the first connecting hole and interference fit with the first connecting hole, and the rotating part is disposed in the second connecting hole and interference fit with the second connecting hole.

Compared with the prior art, the present invention has the following advantages: in the head-mounted display apparatus provided in this embodiment, by setting the connection structure in the wearing head module, the wearing angle of the display module can be conveniently adjusted. And in the optical module, the left lens barrel mechanism comprises a left lens barrel assembly and a left display screen disposed behind the left lens barrel assembly through the left screen bracket; the right lens barrel mechanism comprises a right lens barrel assembly and a right display screen disposed behind the right lens barrel assembly through the right screen bracket. The optical module adopts the left sight distance adjusting mechanism and the right sight distance adjusting mechanism to respectively adjust the sight distance of the left eye and the right eye, so that users can respectively adjust the sight distance of the left lens barrel assembly and the right lens barrel assembly according to the diopters of the left eye and the right eye, so that both eyes can see clearer images, meeting the needs of more users. Moreover, the optical module adopts the left pupillary distance adjustment mechanism and the right pupillary distance adjustment mechanism to separately control the left-eye pupillary distance and the right-eye pupillary distance, so that users can independently adjust the left-eye pupillary distance or the right-eye pupillary distance according to the pupillary distance of his own eyes, the images seen by both eyes through the left lens barrel assembly and the right lens barrel assembly are clearer; and the optical centers of the left lens barrel assembly and the right lens barrel assembly can be prevented from changing relative to the display centers of the left display screen and the right display screen respectively, thereby effectively ensuring the display effect of images in the left lens barrel assembly and the right lens barrel assembly.

BRIEF DESCRIPTION OF THE DRAWINGS

The present invention will be further described with reference to the accompanying drawings and embodiments, in which.

Figure 1:
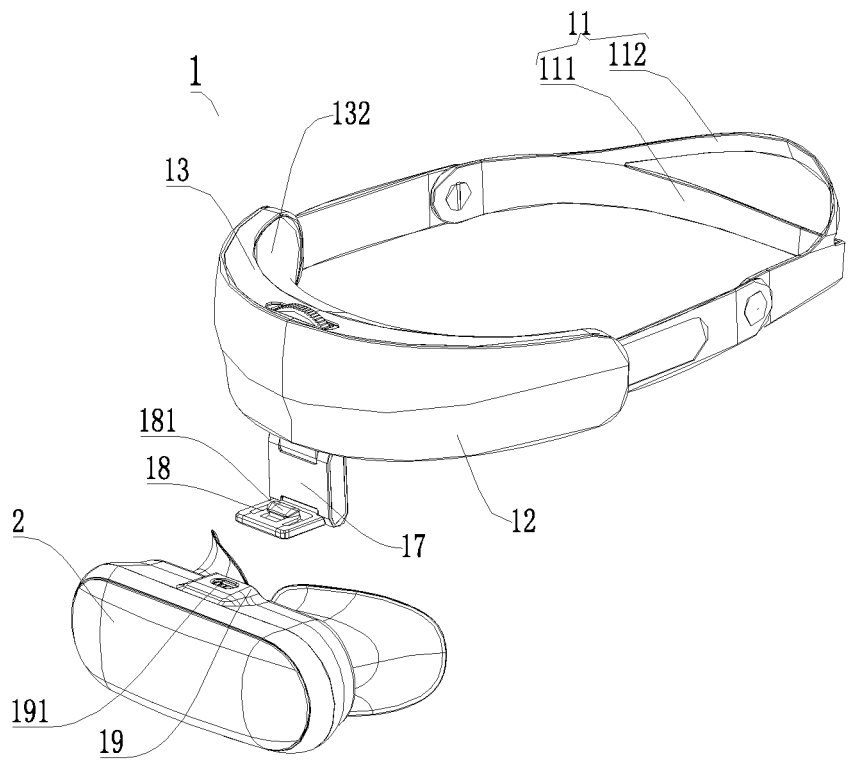
FIG. 1 is a schematic structural diagram of the head-mounted display apparatus according to an embodiment of the present invention.

In the figures: 1, Headband module; 11, Headband body; 111, First body portion; 112, Second body portion; 12, Head-mounted front housing; 121, Positioning hole; 13, Head-mounted rear housing; 131, Slotting; 132, Padding; 14, Elastic adjustment component; 141, Positioning column; 142, First headband connector; 1421, First sliding groove; 1422, First rack; 1423, First hollowed-out groove; 143, Second headband connector; 1431, Second sliding groove; 1432, Second rack; 1433, Second Hollowed-out groove; 15, Control locking component; 151, Limit latch; 1511, Groove part; 1512, Convex part; 152, Locking adjustment button; 1521, Convex column; 1522, Ratchet-shaped binding; 153, Gear piece; 1531, Gear part; 1532, Gripper; 15321, Gripper tooth; 153211, Supporting part; 153212, Rotating groove; 153213, Locking part; 153214, Arc-shaped rotating groove; 153215, Limit groove; 16, Headband storage assembly; 161, First through hole; 162, Second through hole; 163, Turn button; 17, Connection structure; 171, First rotating shaft connecting piece; 172, Second rotating shaft connecting piece; 1721, Accommodating groove; 1722, Side panel; 173, Third rotating shaft connecting piece; 174, Rotating shaft connection assembly; 1741, First connecting hole; 1742, Second connecting hole; 1743, First metal rotating shaft; 17431, Bearing portion; 17432, Fastening part; 17433, Rotating part; 18, Insertion tongue; 181, Bump; 19, Slot; 191, Anti-disengagement groove; 2, Head-mounted display module; 3, Optical module; 31, Module housing; 311, Module front housing; 3111, Pupillary distance limit hole; 312, Module rear housing; 313, Metal mounting shaft; 314, Hollowed-out hole; 32, Left lens barrel mechanism; 321, Left lens barrel assembly; 3211, Left lens barrel housing; 3212, Left lens assembly; 3213, Left connecting hole; 322, Left display screen assembly; 3221, Left display screen; 3222, Left screen bracket; 3223, Left structural groove; 3224, Left sliding groove; 323, Left connecting pin; 324, Left heat dissipation assembly; 3241, Left heat-conducting silica gel; 3242, Left metal heat dissipation pressure plate; 3243, Left fixing pin; 33, Right lens barrel mechanism; 331, Right lens barrel assembly; 3311, Right lens barrel housing; 3312, Right lens assembly; 3313, Right connecting hole; 332, Right display screen assembly; 3321, Right display screen; 3322, Right screen bracket; 3323, Right structural groove; 3324, Right sliding groove; 333, Right connecting pin; 334, Right heat dissipation assembly; 3341, Right heat-conducting silica gel; 3342, Right metal heat dissipation pressure plate; 3343, Right fixing pin; 34, Left sight distance adjusting mechanism; 341, Left adjustment button; 3411, Left rotation control part; 3412, Left driving gear part; 342, Left driven synchronous gear; 343, First left synchronous screw; 3431, First left driven gear part; 3432, First left screw part; 344, Second left synchronous screw; 3441, Second left driven gear part; 3442, Second left screw part; 345, Third left synchronous screw; 3451, Third left driven gear part; 3452, Third left screw part; 346, Left tension wheel; 347, Left synchronous belt; 348, Left sight distance pushing bracket; 3481, Left bracket body; 3482, First left screw hole; 3483, Second left screw hole; 3484, Third left screw hole; 3485, Left bracket connecting part; 3486, Left plastic bone; 35, Right sight distance adjusting mechanism; 351, Right adjustment button; 3511, Right rotation control part; 3512, Right driving gear part; 352, Right driven synchronous gear; 353, First right synchronous screw; 3531, First right driven gear part; 3532, First right screw part; 354, Second right synchronous screw; 3541, Second right driven gear part; 3542, Second right screw part; 355, Third right synchronous screw; 3551, Third right driven gear part; 3552, Third right screw part; 356, Right tension wheel; 357, Right synchronous belt; 358, Right sight distance pushing bracket; 3581, Right bracket body; 3582, First right screw hole; 3583, Second right screw hole; 3584, Third right screw hole; 3585, Right bracket connecting part; 3586, Right plastic bone; 36, Left pupillary distance adjusting mechanism; 361, Left pupillary distance guide shaft; 362, Left lens barrel connecting piece; 3621, Left lens barrel connecting part; 3622, Left guide shaft connecting part; 3623, Left lens barrel through hole; 3624, Left guide through hole; 363, Left pushing piece; 3631, Left groove; 3632, Left pushing insertion hole; 3633, Left pushing gear; 364, Left push button; 3641, Left pushing part; 3642, left extension convex part; 365, Left pupillary distance sliding limiting piece; 3651, Left sliding gear rack; 366, Metal guide limit shaft; 37, Right pupillary distance adjusting mechanism; 371, Right pupillary distance guide shaft; 372, Right lens barrel connecting piece; 3721, Right lens barrel connecting part; 3722, Right guide shaft connecting part; 3723, Right lens barrel through hole; 3724, Right guide through hole; 373, Right pushing piece; 3731, Right groove; 3732, Right pushing insertion hole; 3733, Right pushing gear; 374, Right push button; 3741, Right pushing part; 3742, Right extension convex part; 375, Right pupillary distance sliding limiting piece; 3751, Right sliding gear rack.

DETAILED DESCRIPTION OF THE EMBODIMENTS

In order to have a clearer understanding of the technical features, objectives and effects of the present invention, specific embodiments of the present invention will now be described in detail with reference to accompanying drawings.

FIG. 1 shows the head-mounted display apparatus in this embodiment. The head-mounted display apparatus comprises a headband module 1 and a head-mounted display module 2 connected to the headband module 1, wherein the head-mounted display module 2 comprises a head-mounted display module housing and an optical module 3 arranged in the module housing.

Figure 3:
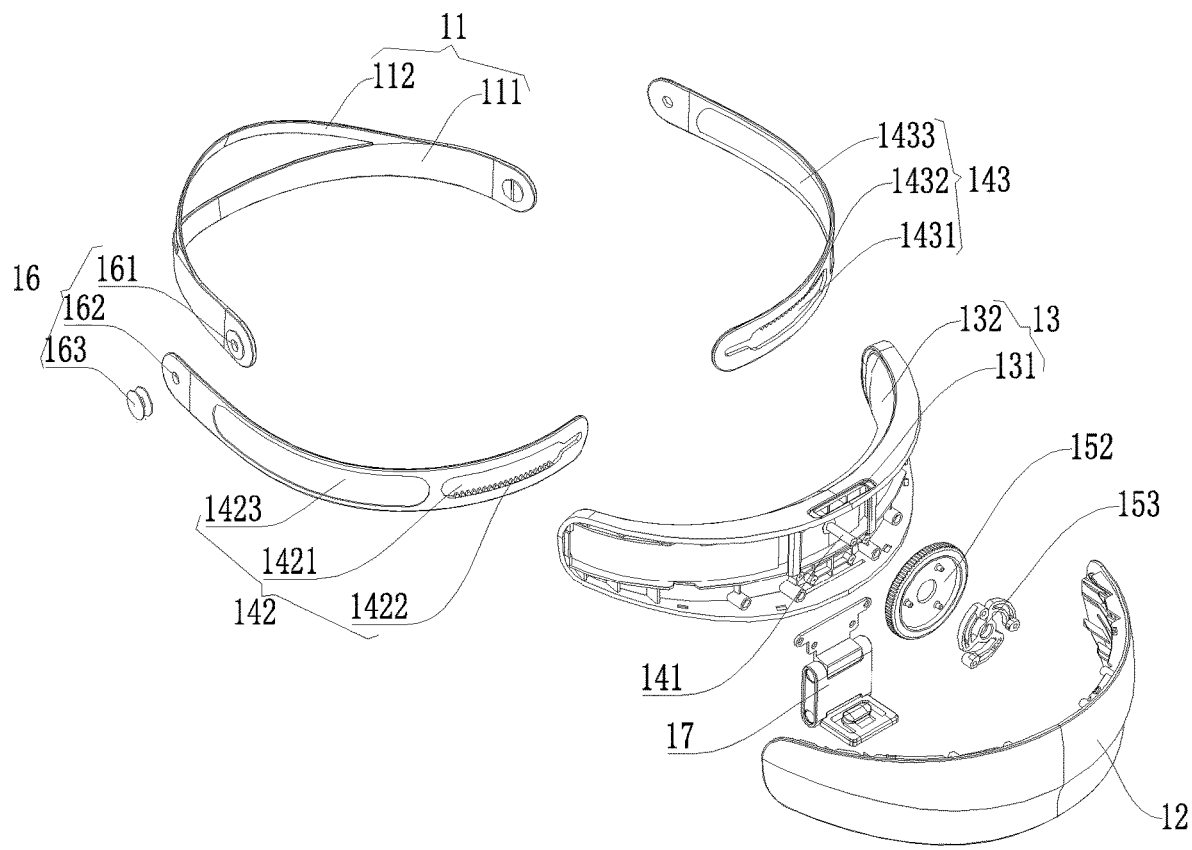
FIG. 3 is a structural decomposition diagram of the headband module according to an embodiment of the present invention.

As shown in FIG. 3, the headband module 1 includes a headband body 11, a front housing 12, a rear housing 13, an elastic adjustment component 14, a control locking component 15, and a connecting structure 17.The head-mounted front housing 12 and the head-mounted rear housing 13 are matched to form an accommodating space. It can be understood that the cushion 132 made of flexible material is provided outside the rear housing 13, and the curvature of the cushion 132 matches the user's forehead, so that the headband module 1 has a good wearing comfort. The elastic adjustment component 14 is disposed in the accommodating space and connected to the headband body 11 for adjusting the tightness of the headband body 11.The control locking component 15 is disposed in the accommodating space and extends out of the head-mounted rear housing 13 or the front housing 12, and is connected to the elastic adjustment component 14 for controlling the elastic adjustment component 14 to adjust the tightness of the headband body 11.

As shown in FIG. 1, the third rotating shaft connecting piece 173 is provided with an insertion tongue 18, and the insertion tongue 18 is provided with a bump 181. The head-mounted display module 2 is provided with a slot 19 for inserting the insertion tongue 18, and the slot 19 is provided with an anti-disengagement groove 191 which is matched with the bump 181. It can be understood that when the headband module 1 and the head-mounted display module 2 are assembled, and the insertion tongue 18 on the third rotating shaft connecting piece 173 is inserted into the slot 19 of the head-mounted display module 2, the bump 181 on the insertion tongue 18 acts with the slot 19 to deform the insertion tongue 18.When the insertion tongue 18 is fully inserted into the slot 19, the bump 181 on the insertion tongue 18 is positioned on the anti-disengagement groove 191 on the slot 19 to prevent the insertion tongue 18 from falling off the slot 19.In the headband module 1, the first rotating shaft connecting piece 171 and the second rotating shaft connecting piece 172, the second rotating shaft connecting piece 172 and the third rotating shaft connecting piece 173 are respectively rotatably connected through a rotating shaft connection assembly 174, and the head-mounted front housing 12 or the rear housing 13 of the first rotating shaft connecting piece 171 are fixedly connected, so that the third rotating shaft connecting piece 173 can be freely adjusted to any angle. The display module 2 of the head-mounted display apparatus is connected to the third rotating shaft connecting piece 173, so that the display module 2 can be adjusted to any angle to make the head-mounted display apparatus more comfortable to wear.

Figure 4:
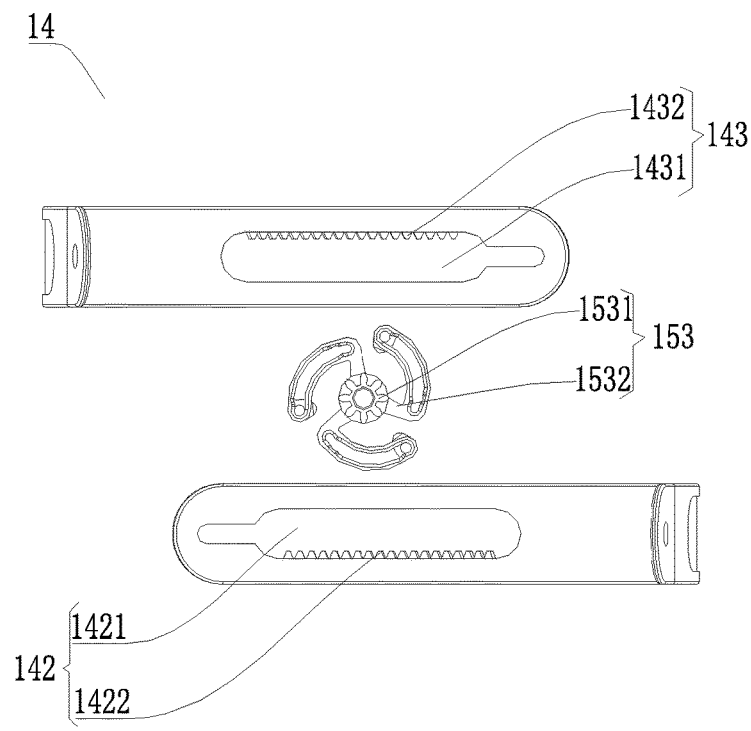
FIG. 4 is a structural decomposition diagram of the elastic adjustment component according to an embodiment of the present invention.

As shown in FIGS. 3 and 4, the elastic adjustment component 14 includes a positioning column 141 disposed inside the rear housing 13 and in contact with the rear housing 13, a first headband connector 142 and a second headband connector 143 disposed at both ends of the headband body 11, and a gear piece 153 sleeved on the positioning column 141. The first headband connector 142 and the second headband connector 143 are sleeved on the positioning column 141 and move toward or away from each other under the drive of the gear piece 153 to adjust the tightness of the headband body 11.Specifically, the first headband connector 142 and the second headband connector 143 are made of PP material and have excellent flexibility and plastic strength. They can move toward each other under the drive of the gear piece 153 to tighten the headband body 11, or move away from each other to loosen the headband body 11 under the drive of the gear piece 153.It can be understood that in order to reduce the weight of the headband module 1, the first hollowed-out groove 1423 or the second hollowed-out groove 1433 may be provided on the first headband connector 142 or the second headband connector 143.

As shown in FIGS. 3 and 4, the first headband connector 142 includes a first sliding groove 1421, and a first rack 1422 disposed on one side of the first sliding groove 1421. The second headband connector 143 includes a second sliding groove 1431, and a second rack 1432 disposed on one side of the second sliding groove 1431, the second rack 1432 are disposed opposite to the first rack 1422. The gear piece 153 includes a gear part 1531 that meshes with the first rack 1422 and the second rack 1432 to move the first headband connector 142 and the second headband connector 143 toward or away from each other. In this embodiment, the first rack 1422 is disposed on the lower side of the first sliding groove 1421 and the second rack 1432 is disposed on the upper side of the second sliding groove 1431, which are disposed opposite to each other and mesh with the gear part 1531 of the gear piece 153. The rotation of the gear part 1531 causes the first headband connector 142 and the second headband connector 143 to move toward or away from each other, to achieve the tightness adjustment of the headband body 11.

It can be understood that since the control locking component 15 is disposed in the accommodating space formed by the head-mounted front housing 12 and the rear housing 13, and extends out of the front housing 12 or the rear housing 13, so that users can control the elastic adjustment component 14 by the control locking component 15 that extends out of the front housing 12 or the rear housing 13, to adjust the tightness of the headband body 11.

Figure 5:
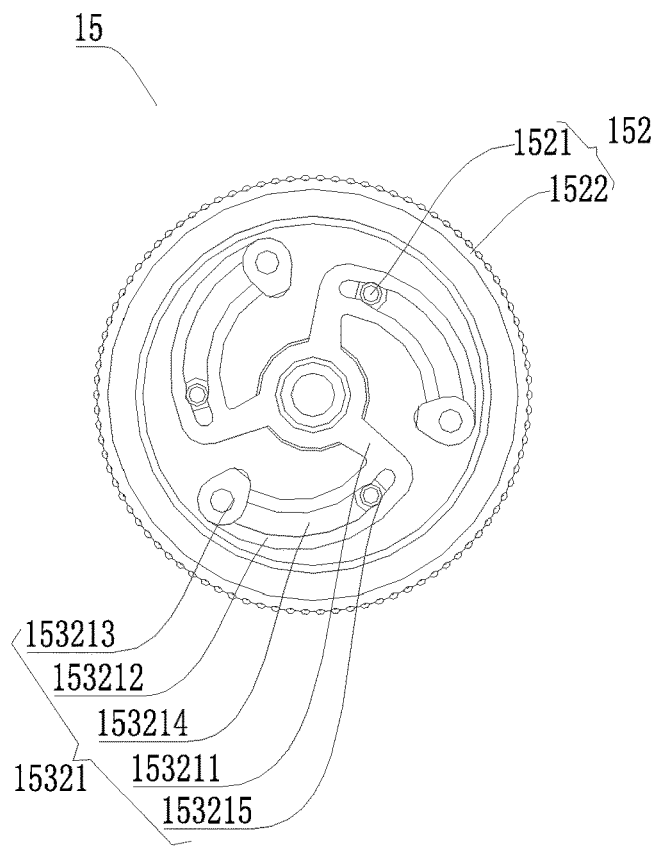
FIG. 5 is a schematic structural diagram of the control locking component according to an embodiment of the present invention.
Figure 6:
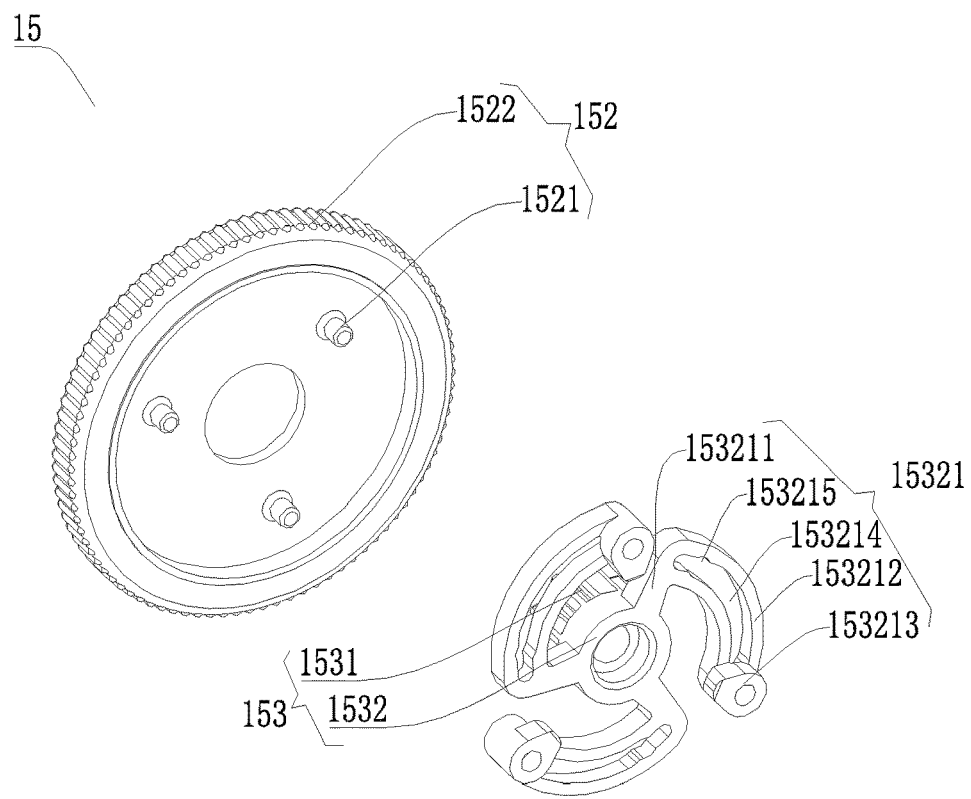
FIG. 6 is a structural decomposition diagram of the control locking component of FIG. 4.
Figure 7:
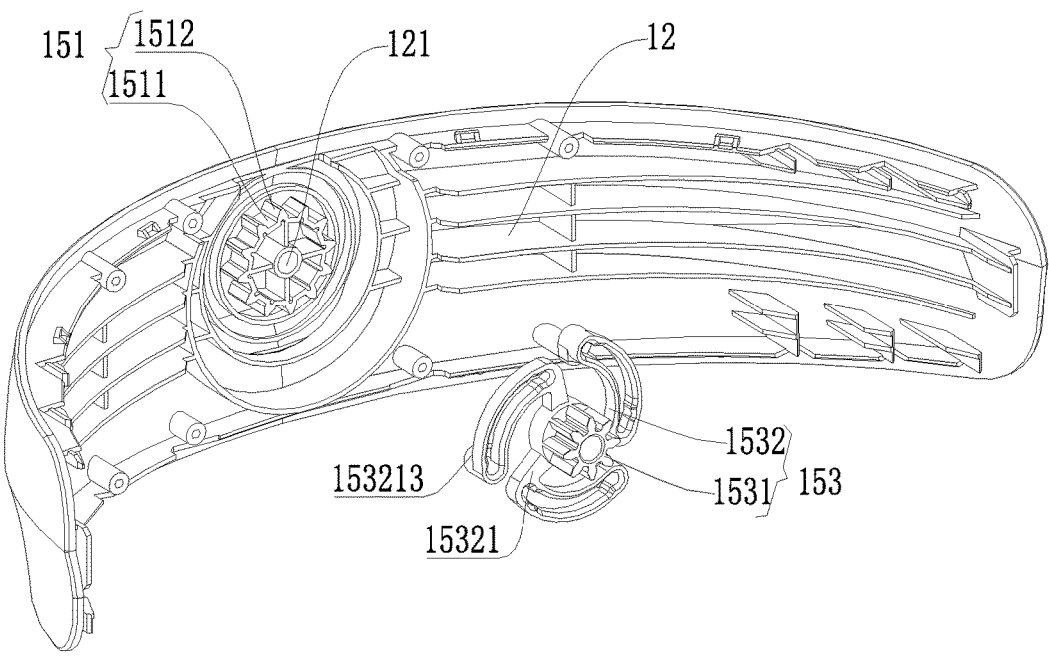
FIG. 7 is a schematic structural diagram of the head-mounted front housing and the gear according to an embodiment of the present invention.

The control locking component 15 includes a limit latch 151 disposed on the head-mounted front housing 12, a locking adjustment button 152 and gear piece 153 sleeved on the positioning column 141. As shown in FIGS. 5-8, the gear piece 153 includes a gear part 1531 and a gripper 1532 integrally formed with the gear part 1531, wherein the gear part 1531 is engaged with the first rack 1422 and the second rack 1432 through the locking adjustment button 152 to move the first headband connector 142 and the second headband connector 143 toward or away from each other, to adjust the tightness of the headband body 11. The gripper 1532 cooperate with the locking adjustment button 152 and the limit latch 151 to control the elastic adjustment component 14 to adjust the tightness of the headband body 11. As shown in FIG. 7, a positioning hole 121 is provided at the center of the limit catch 151 to cooperate with the positioning column 141, so that the positioning column 141 penetrates through the accommodating space formed by the head-mounted front housing 12 and the rear housing 13.

Figure 8:
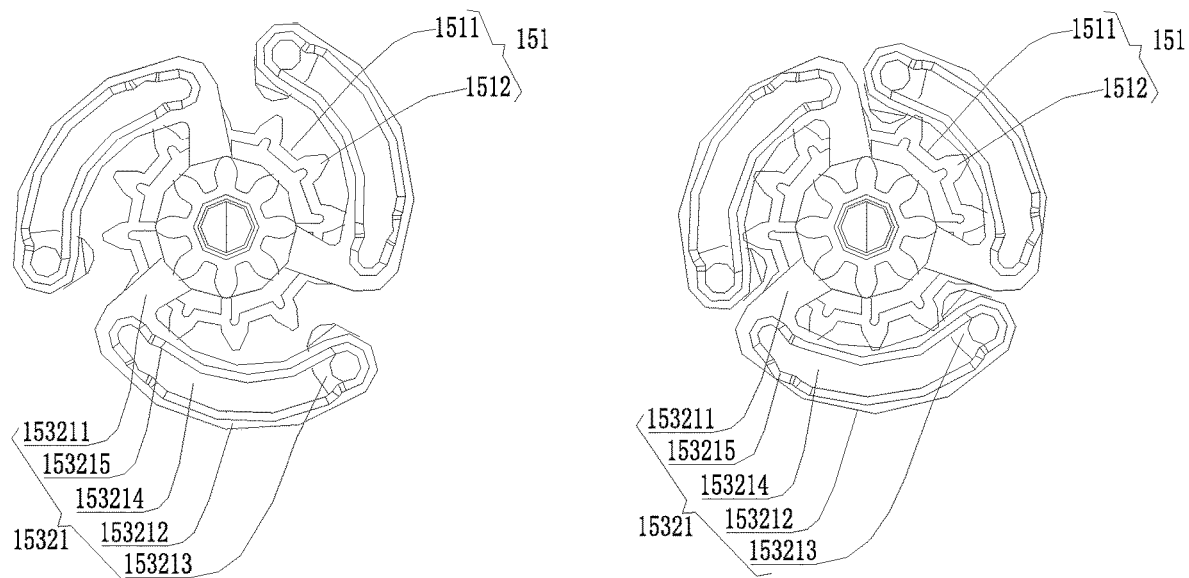
FIG. 8 is a schematic diagram of the unlocked state and locked state of control locking component according to an embodiment of the present invention, wherein 8A is the unlocked state and 8B is the locked state.

As shown in FIGS. 7 and 8, the limit latch 151 includes groove parts 1511 and convex parts 1512 arranged at intervals. As shown in FIGS. 5 and 6, three convex columns 1521 are uniformly disposed on the locking adjustment button 152. The gripper 1532 includes three gripper teeth 15321 that cooperate with the convex columns 1521. Each gripper tooth 15321 includes a supporting part 153211, a rotating groove 153212 extending outward from one end of the supporting part 153211 in a tangential direction, and a locking part 153213 extending from the end of the rotating groove 153212 away from the supporting part 153211; Each rotating groove 153212 is provided with an arc-shaped rotating groove 153214 matched with the convex column 1521, limit groove 153215 is provided at the end of the arc-shaped rotating groove 153214 near the supporting part 153211, and a locking part 153213 is provided at the end away from the limit groove 153215; The locking part 153213 extends from the rotating groove 153212 in a direction away from the gear part 1531 for matching with the groove part 1511 on the limit latch 151 when locking.

As shown in FIG. 8A, when the tightness of the headband body 11 needs to be adjusted, the three convex columns 1521 on the locking adjustment button 152 are positioned in the arc-shaped rotating grooves 153214 of the three gripper teeth 15321, and the locking adjustment button 152 is rotated so that the gear part 1531 of the gear piece 153 drives the first rack 1422 and the second rack 1432 to move toward or away from each other to adjust the tightness of the headband body 11, at this time, the locking parts 153213 of the three gripper teeth 15321 rotate along the periphery of the convex columns 1512 of the limit latch 151.As shown in FIG. 8B, when the gear part 153 drives the first rack 1422 and the second rack 1432 to move toward or away from each other with greater resistance, the three convex columns 1521 on the locking adjustment button 152 break free of the three limit grooves 153215 and slide along the arc-shaped rotating grooves 153214 to the locking parts 153213, causing the rotating grooves 153212 to deform. When the three convex columns 1521 slide to the three locking parts 153213, the locking parts 153213 cooperate with the groove parts 1511 on the limit latch 151 to prevent the gear piece 153 from rotating to achieve the purpose of locking. It can be understood that when the gear piece 153 is locked, a large external force needs to be applied to the locking adjustment button 152 to free the locking parts 153213 from the groove parts 1511 on the limit latch 151, so that the tightness of the headband body 11 can be adjusted again.

It can be understood that a slotting 131 is provided above the head-mounted rear housing 13 or the front housing 12 for the locking adjustment button 152 to extend out, so that the user can control the elastic adjustment component 14 and the control locking component 15 by simply rotating the locking adjustment button 152 outside the slotting 131, making the tightness adjustment process of the headband body 11 easier. Further, the edge of the locking adjustment button 152 is provided with ratchet-shaped binding 1522, which is advantageous to increase the friction force of the locking adjustment button 152 and to adjust the tightness of the headband body 11. Moreover, the ratchet-shaped binding 1522 is made of a flexible material, which makes it feel good and reduces the weight of headband module 1.

Figure 2:
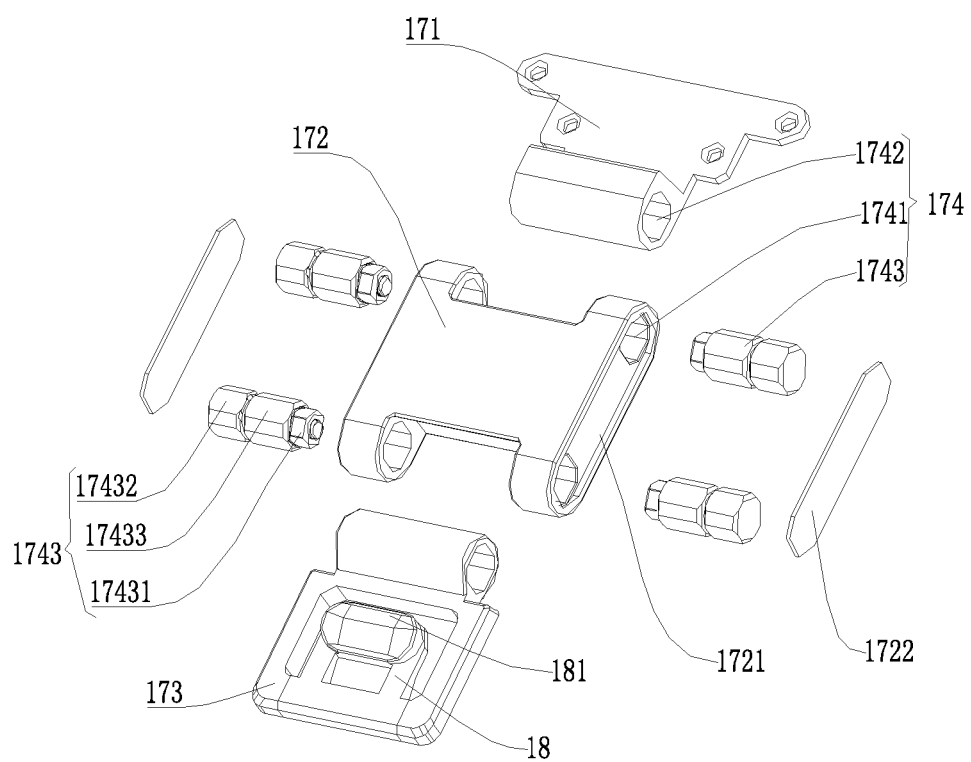
FIG. 2 is a structural decomposition diagram of the connection structure according to an embodiment of the present invention.

As shown in FIG. 2, the connection structure 17 includes a first rotating shaft connecting piece 171, a second rotating shaft connecting piece 172 and a third rotating shaft connecting piece 173. The first rotating shaft connecting piece 171 and the second rotating shaft connecting piece 172 are rotatably connected by a rotating shaft connection assembly 174, and the second rotating shaft connecting piece 172 and the third rotating shaft connecting piece 173 are rotatably connected by a rotating shaft connection assembly 174.One end of the first rotating shaft connecting piece 171 extends into the accommodating space and is fixedly connected with the head-mounted front housing 12 or the rear housing 13.In this embodiment, the first rotating shaft connecting piece 171 is fixed to the head-mounted front housing 12 or the rear housing 13 by bolts and screws, to realize fixed connection with the head-mounted front housing 12 or the rear housing 13.

As shown in FIG. 2, the rotating shaft connecting assembly 174 comprises two first connecting holes 1741 oppositely arranged on the second rotating shaft connecting piece 172, a second connecting hole 1742 arranged on the first rotating shaft connecting piece 171 or the third rotating shaft connecting piece 173, and a rotating shaft (not shown in the figure) for connecting the two first connecting holes 1741 and the second connecting hole 1742; The second connecting hole 1742 is positioned between the two first connecting holes 1741, and a damping structure is arranged between the second connecting hole and the rotating shaft (not shown in the figure). In this embodiment, the second rotating shaft connecting piece 172 is arranged in an I-shape, with two sets of first connecting holes 1741 arranged opposite to each other, with the second connecting hole 1742 arranged between the two sets of first connecting holes 1741, and the two sets of first connecting holes 1741 and the second connecting hole 1742 are connected by a rotating shaft (not shown in the figure), so that the first rotating shaft connecting piece 171 and the third rotating shaft connecting piece 173 provided with the second connecting hole 1742 can rotate relative to the second rotating shaft connecting piece 172 provided with the first connecting hole 1741. A damping structure is provided between the second connecting hole 1742 and the rotating shaft (not shown), so that the first rotating shaft connecting piece 171 or the third rotating shaft connecting piece 173 can rotate relative to the second rotating shaft connecting piece 172 and stay at any angles.

The rotating shaft (not shown) provided in this embodiment includes two first metal rotating shafts 1743.As shown in FIG. 2, the first metal rotating shaft 1743 includes a bearing portion 17431, a fastening part 17432 provided at one end of the bearing portion 17431, and a rotating part 17433 sleeved on the bearing portion 17431. The bearing portion 17431 and the fastening part 17432 are arranged in a T-shape. The rotating part 17433 can rotate relative to the bearing portion 17431, and a damping structure is provided between the rotating part 17433 and the bearing portion 17431 so that the rotating part 17433 can rotate relative to the bearing portion 17431 and stay at any angles. It can be understood that any of the first metal rotating shafts 1743 may connect a first connecting hole 1741 and a second connecting hole 1742.When the first connecting hole 1741 and the second connecting hole 1742 are connected by the first metal rotating shaft 1743, the fastening part 17432 is disposed in the first connecting hole 1741 and interference fit with the first connecting hole 1741, and the rotating part 17433 is disposed in the second connecting hole 1742 and interference fit with the second connecting hole 1742.

It can be understood that each rotating shaft connection assembly 174 uses two first metal rotating shafts 1743 to connect the two first connecting holes 1741 and one second connecting hole 1742. The torsion force of the two first metal rotating shafts 1743 is small and the damping attenuation effect is good during rotation. When any of the first metal rotating shafts 1743 is damaged, the rotating shaft connection assembly 174 can work normally, and the tolerance in manufacturing of the first metal rotating shaft 1743 is smaller and the manufacturing accuracy can be guaranteed.

It can be understood that the rotating shaft may also include only one second metal rotating shaft (not shown), which includes a bearing portion 17431, two fastening parts 17432 provided at both ends of the bearing portion 17431, and a rotating part 17433 sleeved on the bearing portion 17431, i.e., the bearing portion 17431 and the two fastening parts 17432 are arranged in an I-shape. The rotating part 17433 can rotate relative to the bearing part 17431, and a damping structure is provided between the rotating part 17433 and the bearing part 17431, so that the rotating part 17433 can rotate relative to the bearing part 17431 and stay at any angles. When the first connecting hole 1741 and the second connecting hole 1742 are connected by the second metal rotating shaft, the fastening part 17432 is provided in the first connecting hole 1741 and interference fit with the first connecting hole 1741, and the rotating part 17433 is provided in the second connecting hole 1742 and interference fit with the second connecting hole 1742. A second metal rotating shaft is used as the rotating shaft, to connect the first connecting hole 1741 and the second connecting hole 1742, the structure is simple and the assembly process is convenient.

In this embodiment, the cross sections of the first connecting hole 1741 and the second connecting hole 1742 are hexagonal or octagonal, and correspondingly, the cross sections of the fastening part 17432 and the rotating part 17433 are hexagonal or octagonal, so that the assembling process between the first connecting hole 1741 and the fastening part 17432, and between the second connecting hole 1742 and the rotating part 17433 is more convenient, which avoid spending time on angle alignment due to irregular shapes. It can also avoid relative rotation between the first connecting hole 1741 and the fastening part 17432, and between the second connecting hole 1742 and the rotating part 17433 during circular design, which could have affected the angle adjustment effect.

As shown in FIG. 2, the side surface at the position of the first connecting hole 1741 on the second rotating shaft connecting piece 172 is provided with an accommodating groove 1721, and a side panel 1722 matched with the accommodating groove 1721. It can be understood that after the assembly of the shaft connection assembly 174 is completed, the side panel 1722 is placed in the accommodating groove 1721 to prevent the rotating shaft from falling off from the first connecting hole 1741.

As shown in FIG. 3, the headband module 1 also includes a headband storage assembly 16 for saving volume of the headband module 1, easy to carry or store. Specifically, the headband storage assembly 16 includes a first through hole 161 disposed on the headband body 11, a second through hole 162 disposed on the first headband connector 142 and the second headband connector 143, and a turn button 163 matched with the first through hole 161 and the second through hole 162. The headband storage assembly 16 in this embodiment is provided with two groups, which are respectively arranged on the first headband connector 142 and the second headband connector 143 with the headband body 11. When the headband module 1 is not in use, the headband body 11 can be rotated to the side close to the rear housing 13 to realize the storage function. It can be understood that when the headband module 1 is not in use, the headband body 11 can also be tightened by the elastic adjustment component 14 to make the headband module 1 smaller and easier to carry or store.

As shown in FIGS. 1 and 3, the headband body 11 includes a first body portion 111 and a second body portion 112, and the two ends of the first body portion 111 are connected to the two ends of the second body portion 112, respectively. The structure in which the two ends of the first body portion 111 and the second body portion 112 are respectively connected is advantageous to increase the contact area between the headband body 11 and the user's head and make it more secure when worn. On the other hand, it is advantageous to reduce the weight of the headband module 1 and make it more comfortable to wear.

FIGS. 9-16 show the optical module 3 in this embodiment. As shown in FIGS. 9-16, the optical module 3 includes a module housing 31, a left lens barrel mechanism 32, a right lens barrel mechanism 33, a left sight distance adjusting mechanism 34, a right sight distance adjusting mechanism 35, a left pupil distance adjusting mechanism 36 and a right pupil distance adjusting mechanism 37 disposed in the module housing 31.

The left lens barrel mechanism 32 includes a left lens barrel assembly 321 and a left display screen 3221 disposed behind the left lens barrel assembly 321 and connected to the left lens barrel assembly 321. Specifically, the left lens barrel mechanism 32 also includes a left display screen assembly 322 sleeved behind the left lens barrel assembly 321, and the left display screen assembly 322 includes a left display screen 3221 and a left screen bracket 3222 for mounting the left display screen 3221. The right lens barrel mechanism 33 includes a right lens barrel assembly 331 and a right display screen 3321 disposed behind the right lens barrel assembly 331 and connected to the right lens barrel assembly 331. Specifically, the right lens barrel mechanism 33 also includes a right display screen assembly 332 sleeved behind the right lens barrel assembly 331, and the right display screen assembly 332 includes a right display screen 3321 and a right screen bracket 3322 for mounting the right display screen 3321.

The left sight distance adjusting mechanism 34 is disposed inside the module housing 31 and connected to the left display screen assembly 322 for adjusting the distance between the left display screen 3221 and the left lens barrel assembly 321 to achieve sight distance adjustment for the left eye. The right sight distance adjusting mechanism 35 is disposed inside the module housing 31 and connected to the right display screen assembly 332 for adjusting the distance between the right display screen 3321 and the right lens barrel assembly 331 to achieve sight distance adjustment for the right eye.

The left pupillary distance adjusting mechanism 36 is connected to the left lens barrel mechanism 32, for driving the left lens barrel mechanism 32 to move left and right to realize pupillary distance adjustment for the left eye. The right pupillary distance adjusting mechanism 37 is connected to the right lens barrel mechanism 33, for driving the right lens barrel mechanism 33 to move left and right to realize pupillary distance adjustment for the right eye.

In the optical module 3 provided in this embodiment, the left lens barrel mechanism 32 includes a left lens barrel assembly 321 and a left display screen assembly 322 disposed behind the left lens barrel assembly 321. The left display screen assembly 322 includes a left screen bracket 3222 and a left display screen 3221 mounted on the left screen bracket 3222. The right lens barrel mechanism 33 includes a right lens barrel assembly 331 and a right display screen assembly 332 disposed behind the right lens barrel assembly 331. The right display screen assembly 332 includes a right screen bracket 3322 and a right display screen 3321 mounted on the right screen bracket 3322. The left sight distance adjusting mechanism 34 is used to adjust the distance between the left display screen 3221 and the left lens barrel assembly 321, and the right sight distance adjusting mechanism 35 is used to adjust the distance between the right display screen 3321 and the right lens barrel assembly 331 so that the sight distance of the left lens barrel assembly 321 and the right lens barrel assembly 331 can be adjusted respectively, users can adjust the sight distance of the right lens barrel assembly 331 and the left lens barrel assembly 321 according to the diopters of the left eye and the right eye, so that both eyes can see clearer images, meeting needs of more users. Moreover, since the left display screen 3221 and the right display screen 3321 are respectively arranged behind the left lens barrel assembly 321 and the right lens barrel assembly 331, when the left lens barrel assembly 321 and the right lens barrel assembly 331 are respectively controlled to move left and right by the left pupillary distance adjusting mechanism 36 and the right pupillary distance adjusting mechanism 37, the pupillary distance of left eye and right eye can be separately controlled, so that users can freely adjust the pupillary distance of left eye or right eye according to the pupillary distance of his own eyes, and the images seen by both eyes through the left lens barrel assembly 321 and the right lens barrel assembly 331 are clearer; It can prevent the optical centers of the left lens barrel assembly 321 and the right lens barrel assembly 331 from changing relative to the display centers of the left display screen 3221 and the right display screen 3321, respectively, thereby effectively ensuring the display effect of images in the left lens barrel assembly 321 and the right lens barrel assembly 331.

Figure 9:
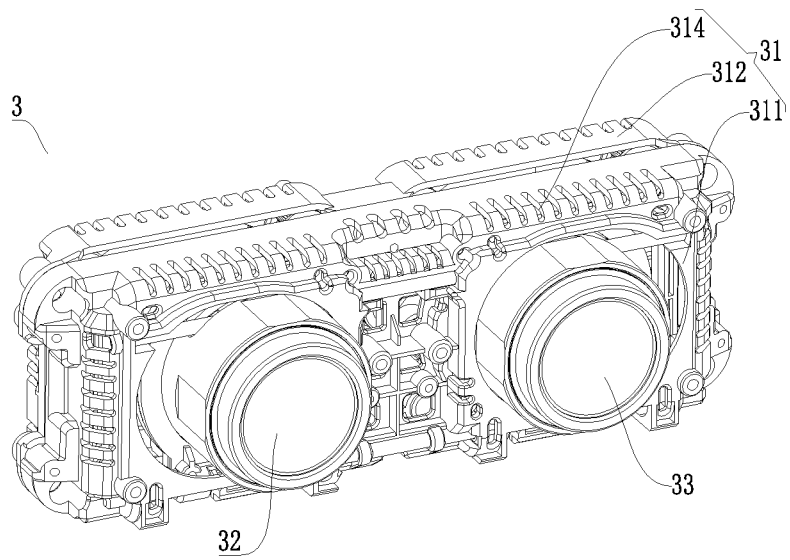
FIG. 9 is a schematic structural diagram of the optical module according to an embodiment of the present invention.
Figure 10:
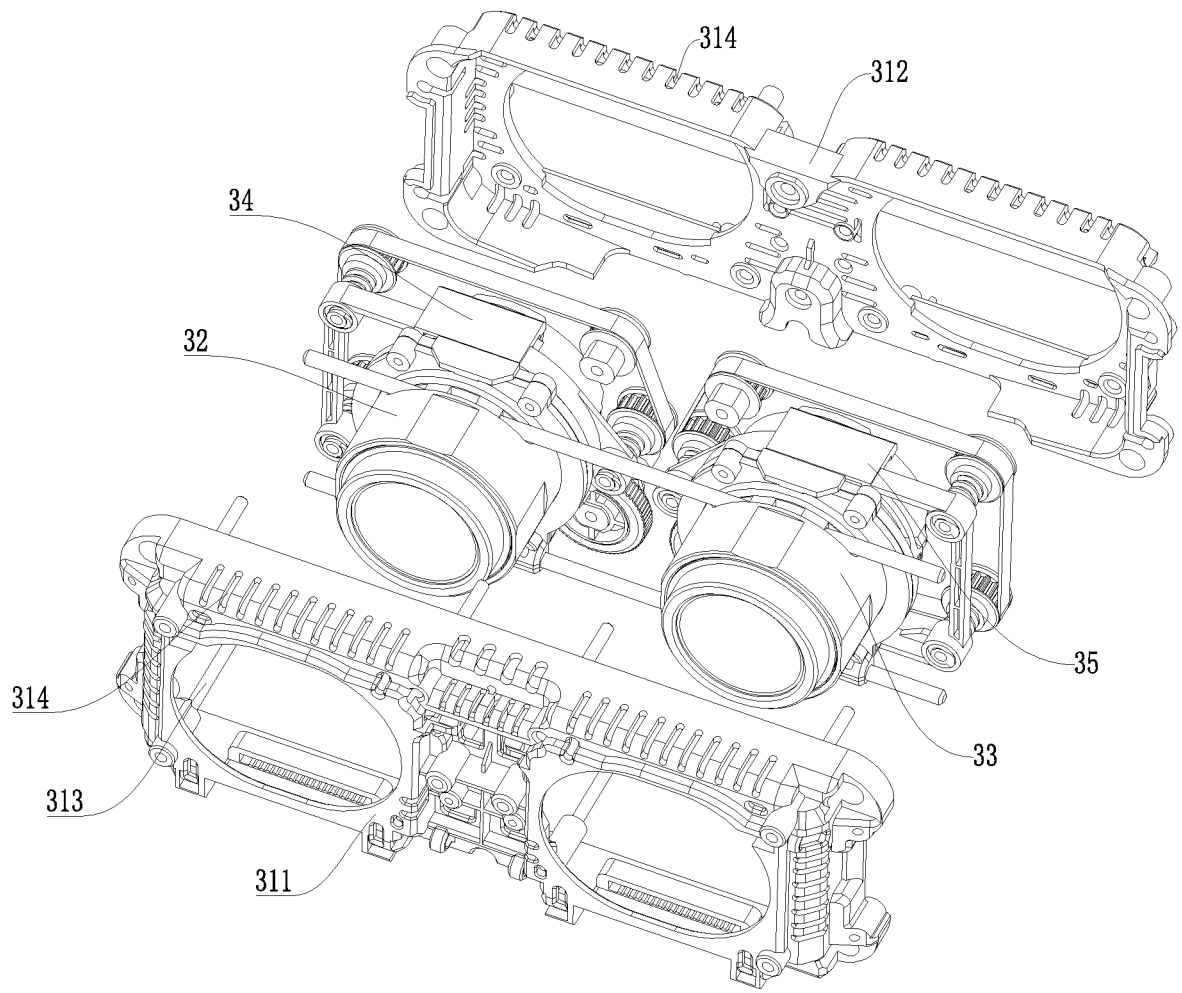
FIG. 10 is structural decomposition diagram of the optical module in FIG. 9.

As shown in FIGS. 9-10, the module housing 31 includes a front housing 311 and a rear housing 312 matched with each other. The front housing 311 is provided with a plurality of metal mounting shafts 313.It can be understood that both the front housing 311 and the rear housing 312 are provided with a plurality of hollowed-out holes 314 for reducing the weight of the front housing 311 and the rear housing 312.

Figure 11:
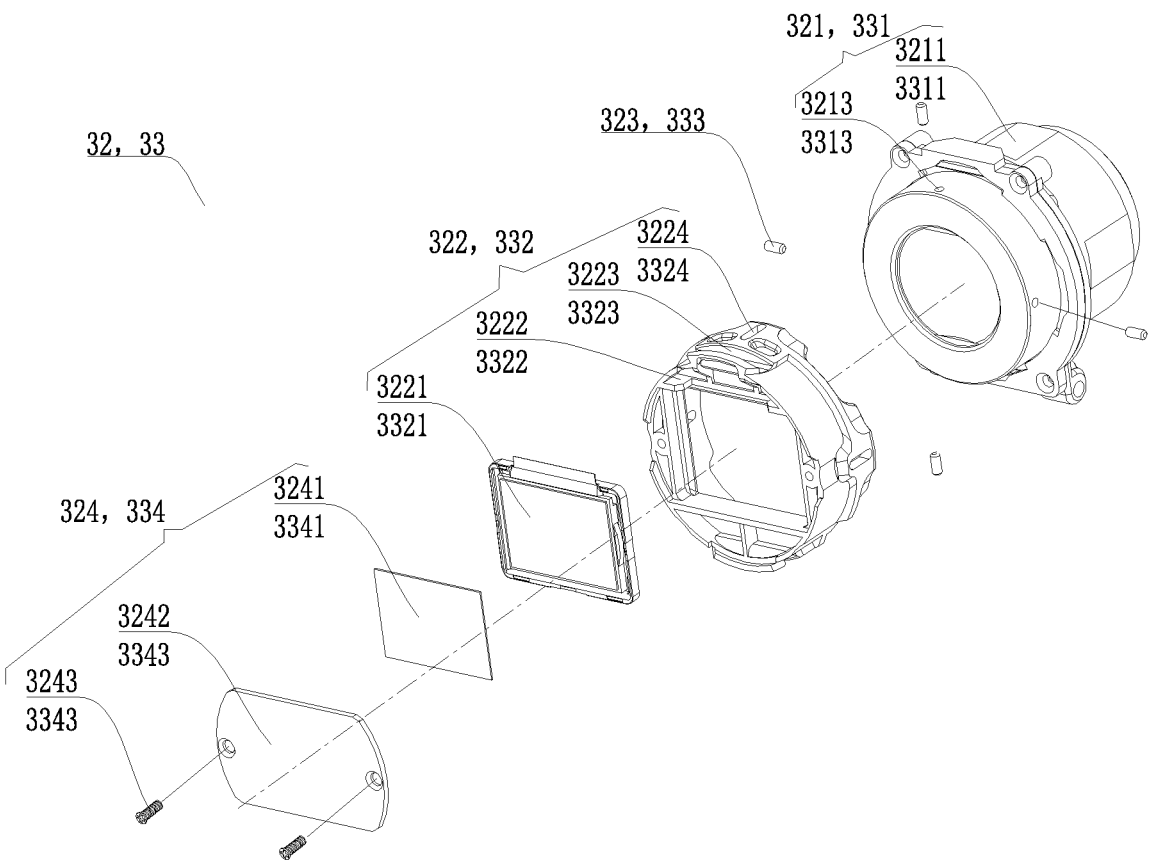
FIG. 11 is a schematic structural diagram of the left lens barrel mechanism and the right lens barrel mechanism in FIG. 10.

As shown in FIG. 11, the left lens barrel mechanism 32 includes a left lens barrel assembly 321 and a left display screen assembly 322 sleeved behind the left lens barrel assembly 321.Specifically, the left lens barrel assembly 321 includes a left lens barrel housing 3211, and a left lens assembly 3212 disposed within the left lens barrel housing 3211.The left lens barrel housing 3211 is provided with at least one left connecting hole 3213.The left display screen assembly 322 includes a left display screen 3221 and a left display bracket 3222 for mounting the left display screen 3221.The left screen bracket 3222 is provided with at least one left sliding groove 3224 arranged along the front-back direction. The left lens barrel mechanism 32 also includes a left connecting pin 323 that passes through the left sliding groove 3224 and is mounted on the left connecting hole 3213, for connecting the left screen bracket 3222 and the left lens barrel housing 3211, preventing the left screen bracket 3222 from falling off the left lens barrel housing 3211 and allowing the left screen bracket 3222 to move relative to the left lens barrel housing 3211 in the front-back direction (i.e., parallel to the direction of the left sliding groove 3224). During the relative movement of the left screen bracket 3222 with respect to the left lens barrel housing 3211, the left display screen 3221 on the left screen bracket 3222 is driven to move relative to the left lens barrel assembly 321, to adjust the distance between the left display screen 3221 and the left lens barrel assembly 321, so as to realize the sight distance adjustment of the left eye.

As shown in FIG. 11, it can be understood that when the left connecting pin 323 passes through the left sliding groove 3224 and is installed in the left connecting hole 3213, the left connecting pin 323 protrudes from the left connecting hole 3213 and falls into the left sliding groove 3224.In this embodiment, four left connecting holes 3213 are uniformly arranged on the left lens barrel housing 3211; four left sliding grooves 3224 are uniformly arranged on the left screen bracket 3222; Correspondingly, four left connecting pins 323 are respectively mounted on the four left connecting holes 3213 through the four left sliding grooves 3224, so that the left lens barrel housing 3211 and the left screen bracket 3222 are more tightly connected.

As shown in FIG. 11, the left lens barrel mechanism 32 also includes a left heat dissipation assembly 324 disposed on the left screen bracket 3222 and close to the left display screen 3221 for preventing the left lens assembly 3212 from being too hot and affecting the imaging effect of the left lens assembly 3212. Specifically, the left heat dissipation assembly 324 includes a left heat-conducting silica gel 3241 and a left metal heat dissipation pressure plate 3242, and the left heat-conducting silica gel 3241 is disposed between the left display screen 3221 and the left metal heat dissipation pressure plate 3242. Among them, the left metal heat dissipation pressure plate 3242 may be made of aluminum sheet or other metal materials.

As shown in FIG. 11, during the assembly process of the left lens barrel mechanism 32, the left display screen 3221 needs to be placed on the left screen bracket 3222, the left heat-conducting silica gel 3241 and the left metal heat dissipation pressure plate 3242 are placed on the left display screen 3221, and then the left metal heat dissipation pressure plate 3242 is fixedly connected to the left screen bracket 3222 by the left fixing pin 3243. Then, the left screen bracket 3222 is sleeved on the left lens barrel housing 3211 of the left lens barrel assembly 321, so that the four left connecting holes 3213 on the left lens barrel housing 3211 are respectively positioned on the four left sliding grooves 3224 of the left screen bracket 3222, and the four left connecting pins 323 are respectively inserted into the four left connecting holes 3213 to realize the assembly of the left lens barrel mechanism 32. It can be understood that the left screen bracket 3222 in the assembled left lens barrel mechanism 32 can move back and forth relative to the left lens barrel housing 3211 (i.e., in the direction of the left sliding groove 3224), and its movement range is the length of the left sliding groove 3224. It can be understood that the left screen bracket 3222 is sleeved on the left lens barrel housing 3211, that is, the left screen bracket 3222 is positioned behind the left lens assembly 3212, which can achieve good dustproof effect.

As shown in FIG. 11, the right lens barrel mechanism 33 includes a right lens barrel assembly 331 and a right display screen assembly 332 sleeved behind the right lens barrel assembly 321.Specifically, the right lens barrel assembly 331 includes a right lens barrel housing 3311, and a right lens assembly 3312 disposed within the right lens barrel housing 3311.The right lens barrel housing 3311 is provided with at least one right connecting hole 3313.The right display screen assembly 332 includes a right display screen 3321 and a right display bracket 3322 for mounting the right display screen 3321.The right screen bracket 3322 is provided with at least one right sliding groove 3324 arranged along the front-back direction. The right lens barrel mechanism 33 also includes a right connecting pin 333 that passes through the right sliding groove 3324 and is mounted on the right connecting hole 3313, for connecting the right screen bracket 3322 and the right lens barrel housing 3311, preventing the right screen bracket 3322 from falling off the right lens barrel housing 3311 and allowing the right screen bracket 3322 to move relative to the right lens barrel housing 3311 in the front-back direction (i.e., parallel to the direction of the right sliding groove 3324). During the relative movement of the right screen bracket 3322 with respect to the right lens barrel housing 3311, the right display screen 3321 on the right screen bracket 3322 is driven to move relative to the right lens barrel assembly 331, to adjust the distance between the right display screen 3321 and the right lens barrel assembly 331, so as to realize the sight distance adjustment of the right eye.

It can be understood that when the right connecting pin 333 passes through the right sliding groove 3324 and is installed in the right connecting hole 3313, the right connecting pin 333 protrudes from the right connecting hole 3313 and falls into the right sliding groove 3324. In this embodiment, four right connecting holes 3313 are uniformly arranged on the right lens barrel housing 3311; four right sliding grooves 3324 are uniformly arranged on the right screen bracket 3322; Correspondingly, four right connecting pins 333 are respectively mounted on the four right connecting holes 3313 through the four right sliding grooves 3324, so that the right lens barrel housing 3311 and the right screen bracket 3322 are more tightly connected.

As shown in FIG. 11, the right lens barrel mechanism 33 also includes a right heat dissipation assembly 334 disposed on the right screen bracket 3322 and close to the right display screen 3321 for preventing the right lens assembly 3312 from being too hot and affecting the imaging effect of the right lens assembly 3312. Specifically, the right heat dissipation assembly 334 includes a right heat-conducting silica gel 3341 and a right metal heat dissipation pressure plate 3342, and the right heat-conducting silica gel 3341 is disposed between the right display screen 3321 and the right metal heat dissipation pressure plate 3342. Among them, the right metal heat dissipation pressure plate 3342 may be made of aluminum sheet or other metal materials.

As shown in FIG. 11, during the assembly process of the right lens barrel mechanism 33, the right display screen 3321 needs to be placed on the right screen bracket 3322, the right heat-conducting silica gel 3341 and the right metal heat dissipation pressure plate 3342 are placed on the right display screen 3321, and then the right metal heat dissipation pressure plate 3342 is fixedly connected to the right screen bracket 3322 by the right fixing pin 3343. Then, the right screen bracket 3322 is sleeved on the right lens barrel housing 3311 of the right lens barrel assembly 331, so that the four right connecting holes 3313 on the right lens barrel housing 3311 are respectively positioned on the four right sliding grooves 3324 of the right screen bracket 3322, and the four right connecting pins 333 are respectively inserted into the four right connecting holes 3313 to realize the assembly of the right lens barrel mechanism 33. It can be understood that the right screen bracket 3322 in the assembled right lens barrel mechanism 33 can move back and forth relative to the right lens barrel housing 3311 (i.e., in the direction of the right sliding groove 3324), and its movement range is the length of the right sliding groove 3324. It can be understood that the right screen bracket 3322 is sleeved on the right lens barrel housing 3311, that is, the right screen bracket 3322 is positioned behind the right lens assembly 3312, which can achieve good dustproof effect.

Figure 12:
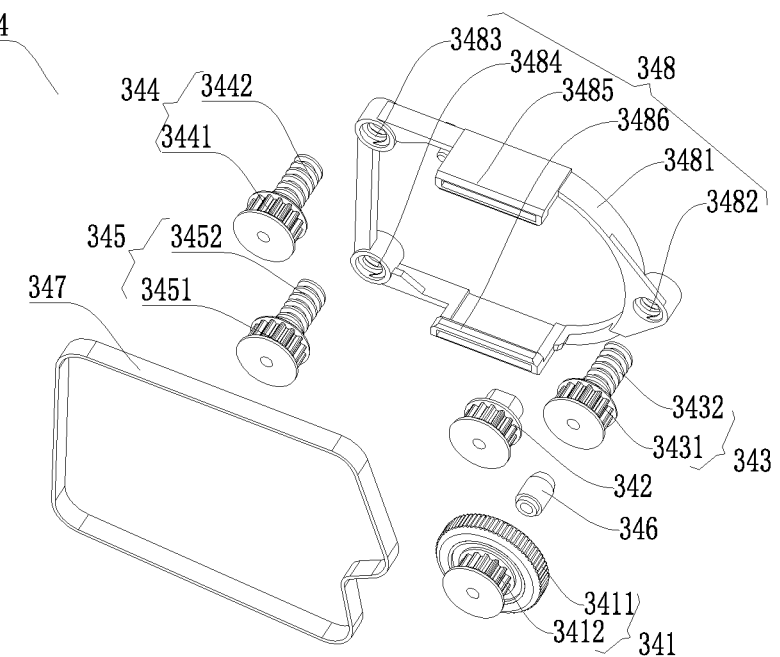
FIG. 12 is a structural decomposition diagram of the left sight distance adjusting mechanism in FIG. 10.
Figure 13:
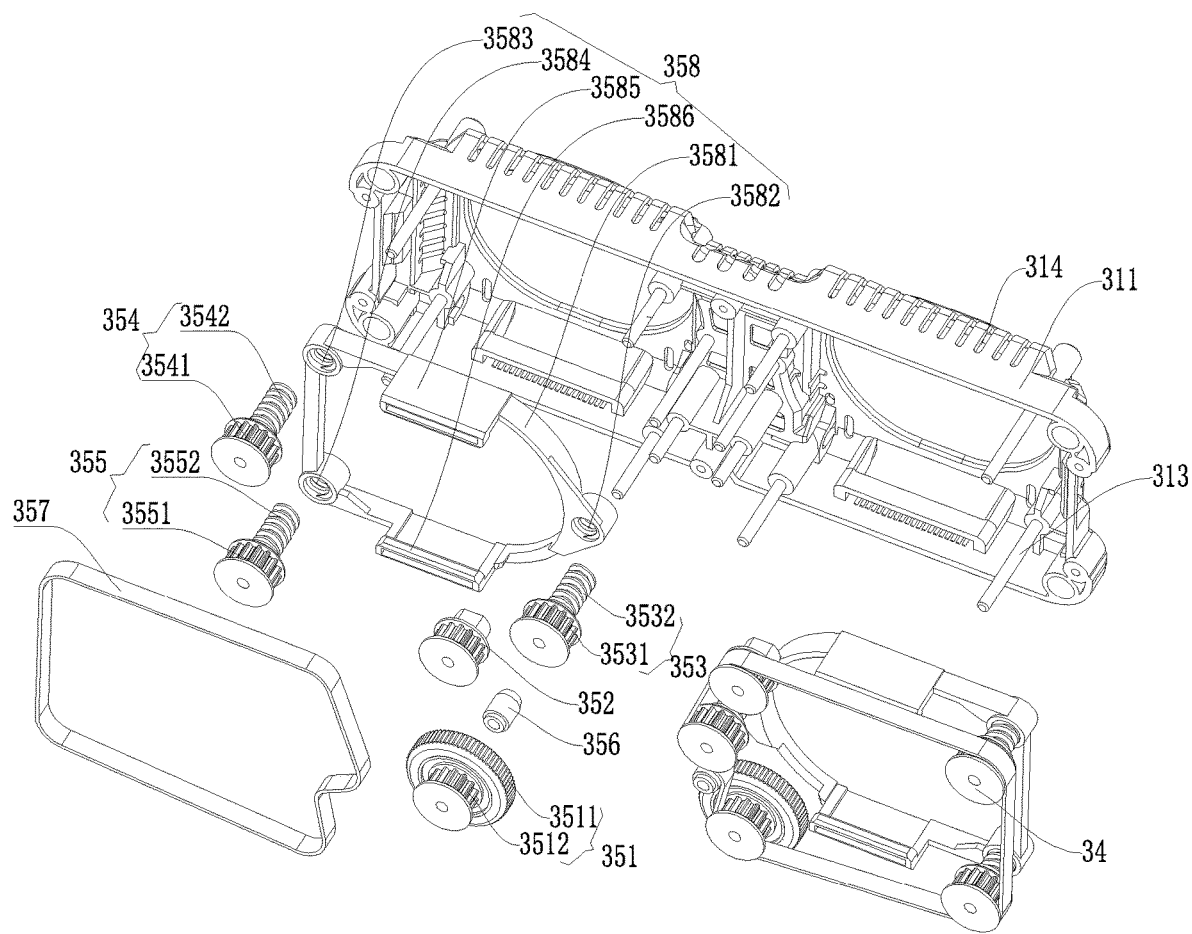
FIG. 13 is a diagram of the assembled state of the left sight distance adjusting mechanism and right sight distance adjusting mechanism in FIG. 10.
Figure 14:
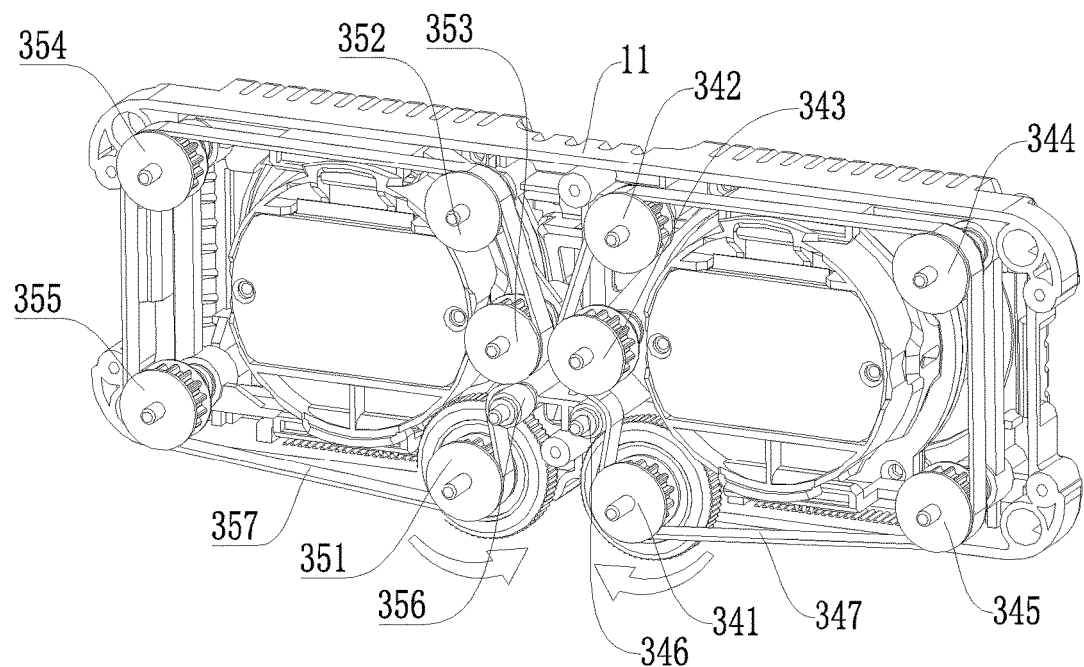
FIG. 14 is an another diagram of the assembled state of the left sight distance adjusting mechanism and the right sight distance adjusting mechanism in FIG. 10.

As shown in FIGS. 12-14, the left sight distance adjusting mechanism 34 includes a left adjustment button 341, a left driven synchronous gear 342, a first left synchronous screw 343, a second left synchronous screw 344, a third left synchronous screw 345, a left tension wheel 346, a left synchronous belt 347, and a left sight distance pushing bracket 348. The left sight distance pushing bracket 348 is connected to the left screen bracket 3222, and the left sight distance pushing bracket 348 is disposed on the first left synchronous screw 343, the second left synchronous screw 344, and the third left synchronous screw 345. The left adjustment button 341, left driven synchronous gear 342, first left synchronous screw 343, second left synchronous screw 344, third left synchronous screw 345, left tension wheel 346 and left synchronous belt 347 are matched, so that the left sight distance pushing bracket 348 drives the left screen bracket 3222 to move back and forth. It can be understood that the left adjustment button 341, left driven synchronous gear 342, first left synchronous screw 343, second left synchronous screw 344, third left synchronous screw 345, and the left tension wheel 346 on the left sight distance adjusting mechanism 34 are respectively arranged on the metal mounting shaft 313 on the module front housing 311, and matched with the left synchronous belt 347 to achieve the transmission effect.

As shown in FIG. 12, the left adjustment button 341 includes an integrally-formed left rotation control part 3411 and left driving gear part 3412. The first left synchronous screw 343 includes an integrally-formed first left driven gear part 3431 and a first left screw part 3432. The second left synchronous screw 344 includes an integrally-formed second left driven gear part 3441 and a second left screw part 3442. The third left synchronous screw 345 includes an integrally-formed third left driven gear part 3451 and a third left screw part 3452. The left sight distance pushing bracket 348 includes a left bracket body 3481, and a first left screw hole 3482, a second left screw hole 3483, a third left screw hole 3484, and a left bracket connecting part 3485 disposed on the left bracket body 3481. Among them, the left driving gear part 3412 on the left adjustment button 341, left tension wheel 346, left driven synchronous gear 342, first left driven gear part 3431 on the first left synchronous screw 343, second left driven gear part 3441 on the second left synchronous screw 344, and the third left driven gear part 3451 on the third left synchronous screw 345 are matched with the left synchronous belt 347, to realize synchronous transmission. It can be understood that, the first left screw part 3432 of the first left synchronous screw 343 matches with the first left screw hole 3482, the second left screw part 3442 of the second left synchronous screw 344 matches with the second left screw hole 3483, and the third left screw part 3452 of the third left synchronous screw 345 matches with the third left screw hole 3484, to move the left bracket body 3481 back and forth. It can be understood that, the first left driven gear part 3431, second left driven gear part 3441 and third left driven gear part 3451 are provided with outer helical teeth, and correspondingly, the first left screw hole 3482, second left screw hole 3483 and third left screw hole 3484 are provided with inner helical teeth that are matched with the outer helical teeth.

As shown in FIG. 12, the left sight distance pushing bracket 348 includes two left bracket connecting parts 3485 arranged opposite to each other from top to bottom, and each left bracket connecting part 3485 is provided with a left plastic bone 3486 extending inward; Correspondingly, as shown in FIG. 11, the left screen bracket 3222 is provided with two left structural grooves 3223 which are matched with the left plastic bones 3486 in the vertical direction. In the assembly process, the left plastic bones 3486 of the two left bracket connecting parts 3485 on the left sight distance pushing bracket 348 are inserted into the two left structural grooves 3223 of the left screen bracket 3222 respectively, to realize the connection between the left sight distance pushing bracket 348 and the left screen bracket 3222, so that the left screen bracket 3222 can be driven to move when the left sight distance pushing bracket 348 moves, to make the left display screen 3221 on the left screen bracket 3222 move relative to the left lens assembly 3212.

In the assembly process of the left sight distance adjusting mechanism 34, the left sight distance pushing bracket 348 is first assembled with the first left synchronous screw 343, second left synchronous screw 344, and third left synchronous screw 345 (i.e., the first left synchronous screw 343, second left synchronous screw 344, and third left synchronous screw 345 are respectively inserted into the first left screw hole 3482, second left screw hole 3483, and third left screw hole 3484), and the first left synchronous screw 343, second left synchronous screw 344, and third left synchronous screw 345 are rotated to the end. It can be understood that the first left screw part 3432, second left screw part 3442 and the third left screw part 3452 need to be coated with lubricating oil when the left sight distance pushing bracket 348 is assembled with the first left synchronous screw 343, second left synchronous screw 344, and third left synchronous screw 345, so as to achieve the effect of adjusting without abnormal noise and rotating with uniform force. Then, the first left synchronous screw 343, second left synchronous screw 344, and third left synchronous screw 345 are assembled to the metal mounting shaft 313 of the module front housing 311. Then, the left adjustment button 341, left driven synchronous gear 342 and left tension wheel 346 are assembled on the metal mounting shaft 313 of the module front housing 311, and then the synchronous belt 347 is sleeved on the left driving gear part 3412, the left tension wheel 346, the left driven synchronous gear 342, the first left driven gear part 3431 of the first left synchronous screw 343, the second left driven gear part 3441 of the second left synchronous screw 344, and the third left driven gear part 3451 of the third left synchronous screw 345, so the assembly of the left sight distance adjusting mechanism 34 is completed. Then, the left plastic bones 3486 of the two left bracket connecting parts 3485 on the left sight distance pushing bracket 348 are respectively inserted into the two left structural grooves 3223 of the left screen bracket 3222, so as to assemble the left lens barrel mechanism 32 to the left sight distance adjusting mechanism 34.

It can be understood that after the left lens barrel mechanism 32 is assembled to the left sight distance adjusting mechanism 34, pushing the left adjustment button 341 with hand, to make the left synchronous belt 347 drives the left driven synchronous gear 342, first left synchronous screw 343, second left synchronous screw 344, third left synchronous screw 345 and left tension wheel 346 to rotate simultaneously; so that the first left driven gear part 3431 of the first left synchronous screw 343, the second left driven gear part 3441 of the second left synchronous screw 344, and the third left driven gear part 3451 of the third left synchronous screw 345 also rotate; On the left sight distance pushing bracket 348, because the inner helical teeth on the first left screw hole 3482, second left screw hole 3483, and third left screw hole 3484 are matched with the outer helical teeth on the first left driven gear part 3431, second left driven gear part 3441, and third left driven gear part 3451, respectively, the left sight distance pushing bracket 348 moves back and forth differently according to the different rotation directions under the driven of the outer helical teeth. The left sight distance pushing bracket 348 is provided with two left plastic bones 3486 oppositely, the two left plastic bones 3486 are mounted in the left structural groove 3223 of the left screen bracket 3222, so as to drive the left screen bracket 3222 to move back and forth when the left sight distance pushing bracket 348 moves back and forth, and the range of the left screen bracket 3222 moving back and forth is the length of the left sliding groove 3224. Since the left screen bracket 3222 is sleeved behind the left lens barrel assembly 321, and the left display screen 3221 is arranged thereon; among them, the left lens barrel assembly 321 includes a left lens barrel housing 3211 and a left lens assembly 3212 disposed in the left lens barrel housing 3211. When a person's left eye views an image displayed on the left display screen 3221 through the left lens barrel assembly 321, the user can adjust the left screen bracket 3222 to drive the left display screen 3221 to move back and forth, so as to realize the sight distance adjustment of the left eye to suit the hyperopia or myopia of the left eye.

As shown in FIG. 13, the right sight distance adjusting mechanism 35 includes a right adjustment button 351, a right driven synchronous gear 352, a first right synchronous screw 353, a second right synchronous screw 354, a third right synchronous screw 355, a right tension wheel 356, a right synchronous belt 357, and a right sight distance pushing bracket 348.The right sight distance pushing bracket 358 is connected to the right screen bracket 3322, and the right sight distance pushing bracket 358 is disposed on the first right synchronous screw 353, the second right synchronous screw 354, and the third right synchronous screw 345.The right adjustment button 351, right driven synchronous gear 352, first right synchronous screw 353, second right synchronous screw 354, third right synchronous screw 355, right tension wheel 356 and right synchronous belt 357 are matched, so that the right sight distance pushing bracket 358 drives the right screen bracket 3322 to move back and forth. It can be understood that the right adjustment button 351, right driven synchronous gear 352, first right synchronous screw 353, second right synchronous screw 354, third right synchronous screw 355, and the right tension wheel 356 on the right sight distance adjusting mechanism 35 are respectively arranged on the metal mounting shaft 313 on the module front housing 311, and matched with the right synchronous belt 357 to achieve the transmission effect.

As shown in FIG. 13, the right adjustment button 351 includes an integrally-formed right rotation control part 3511 and right driving gear part 3512.The first right synchronous screw 353 includes an integrally-formed first right driven gear part 3531 and a first right screw part 3532.The second right synchronous screw 354 includes an integrally-formed second right driven gear part 3541 and a second right screw part 3542.The third right synchronous screw 355 includes an integrally-formed third right driven gear part 3551 and a third right screw part 3552.The right sight distance pushing bracket 358 includes a right bracket body 3581, and a first right screw hole 3582, a second right screw hole 3583, a third right screw hole 3584, and a right bracket connecting part 3585 disposed on the right bracket body 3581.Among them, the right driving gear part 3512 on the right adjustment button 351, right tension wheel 356, right driven synchronous gear 352, first right driven gear part 3531 on the first right synchronous screw 353, second right driven gear part 3541 on the second right synchronous screw 354, and the third right driven gear part 3551 on the third right synchronous screw 355 are matched with the right synchronous belt 357, to realize synchronous transmission. It can be understood that, the first right screw part 3532 of the first right synchronous screw 353 matches with the first right screw hole 3582, the second right screw part 3542 of the second right synchronous screw 354 matches with the second right screw hole 3583, and the third right screw part 3552 of the third right synchronous screw 355 matches with the third right screw hole 3584, to move the right bracket body 3581 back and forth. It can be understood that, the first right driven gear part 3531, second right driven gear part 3541 and third right driven gear part 3551 are provided with outer helical teeth, and correspondingly, the first right screw hole 3582, second right screw hole 3583 and third right screw hole 3584 are provided with inner helical teeth that are matched with the outer helical teeth.

As shown in FIG. 13, the right sight distance pushing bracket 358 includes two right bracket connecting parts 3585 arranged opposite to each other from top to bottom, and each right bracket connecting part 3585 is provided with a right plastic bone 3586 extending inward; correspondingly, as shown in FIG. 11, the right screen bracket 3322 is provided with two right structural grooves 3323 which are matched with the right plastic bones 3586 in the vertical direction. In the assembly process, the right plastic bones 3586 of the two right bracket connecting parts 3585 on the right sight distance pushing bracket 358 are inserted into the two right structural grooves 3323 of the right screen bracket 3322 respectively, to realize the connection between the right sight distance pushing bracket 358 and the right screen bracket 3322, so that the right screen bracket 3322 can be driven to move when the right sight distance pushing bracket 358 moves, to make the right display screen 3321 on the right screen bracket 3322 move relative to the right lens assembly 3312.

In the assembly process of the right sight distance adjusting mechanism 35, the right sight distance pushing bracket 358 is first assembled with the first right synchronous screw 353, second right synchronous screw 354, and third right synchronous screw 355 (i.e., the first right synchronous screw 353, second right synchronous screw 354, and third right synchronous screw 355 are respectively inserted into the first right screw hole 3582, second right screw hole 3583, and third right screw hole 3584), and the first right synchronous screw 353, second right synchronous screw 354, and third right synchronous screw 355 are rotated to the end. It can be understood that the first right screw part 3532, second right screw part 3542 and the third right screw part 3552 need to be coated with lubricating oil when the right sight distance pushing bracket 358 is assembled with the first right synchronous screw 353, second right synchronous screw 354, and third right synchronous screw 355, so as to achieve the effect of adjusting without abnormal noise and rotating with uniform force. Then, the first right synchronous screw 353, second right synchronous screw 354, and third right synchronous screw 355 are assembled to the metal mounting shaft 313 of the module front housing 311. Then, the right adjustment button 351, right driven synchronous gear 352 and right tension wheel 356 are assembled on the metal mounting shaft 313 of the module front housing 311, and then the synchronous belt 357 is sleeved on the right driving gear part 3512, the right tension wheel 356, the right driven synchronous gear 352, the first right driven gear part 3531 of the first right synchronous screw 353, the second right driven gear part 3541 of the second right synchronous screw 354, and the third right driven gear part 3551 of the third right synchronous screw 355, so the assembly of the right sight distance adjusting mechanism 35 is completed. Then, the right plastic bones 3586 of the two right bracket connecting parts 3585 on the right sight distance pushing bracket 358 are respectively inserted into the two right structural grooves 3323 of the right screen bracket 3322,so as to assemble the right lens barrel mechanism 33 to the right sight distance adjusting mechanism 35.

It can be understood that after the right lens barrel mechanism 33 is assembled to the right sight distance adjusting mechanism 35, pushing the right adjustment button 351 with hand, to make the right synchronous belt 357 drives the right driven synchronous gear 352, first right synchronous screw 353, second right synchronous screw 354, third right synchronous screw 355 and right tension wheel 356 to rotate simultaneously; so that the first right driven gear part 3531 of the first right synchronous screw 353, the second right driven gear part 3541 of the second right synchronous screw 354, and the third right driven gear part 3551 of the third right synchronous screw 355 also rotate; On the right sight distance pushing bracket 358, because the inner helical teeth on the first right screw hole 3582, second right screw hole 3583, and third right screw hole 3584 are matched with the outer helical teeth on the first right driven gear part 3531, second right driven gear part 3541, and third right driven gear part 3551, respectively, the right sight distance pushing bracket 358 moves back and forth differently according to the different rotation directions under the driven of the outer helical teeth. The right sight distance pushing bracket 358 is provided with two right plastic bones 3586 oppositely, the two right plastic bones 3586 are mounted in the right structural groove 3323 of the right screen bracket 3322, so as to drive the right screen bracket 3322 to move back and forth when the right sight distance pushing bracket 358 moves back and forth, and the range of the right screen bracket 3322 moving back and forth is the length of the right sliding groove 3324. Since the right screen bracket 3322 is sleeved behind the right lens barrel assembly 331, and the right display screen 3321 is arranged thereon; Among them, the right lens barrel assembly 331 includes a right lens barrel housing 3311 and a right lens assembly 3312 disposed in the right lens barrel housing 3311. When a person's right eye views an image displayed on the right display screen 3321 through the right lens barrel assembly 331, the user can adjust the right screen bracket 3322 to drive the right display screen 3321 to move back and forth, so as to realize the sight distance adjustment of the right eye to suit the hyperopia or myopia of the right eye.

As can be understood, in the optical module 3 provided in this embodiment, the left sight distance adjusting mechanism 34 for adjusting the distance between the left display screen 3221 and the left lens barrel assembly 321, and the right sight distance adjusting mechanism 35 for adjusting the distance between the right display screen 3321 and the right lens barrel assembly 331 are respectively provided, so that the sight distance of the left lens barrel assembly 321 and the right lens barrel assembly 331 can be separately adjusted, so users can independently adjust the sight distance of the right lens barrel assembly 331 and the left lens barrel assembly 321 according to the diopters of the left eye and the right eye, so that both eyes can see clearer images, meeting the needs of more users.

Figure 15:
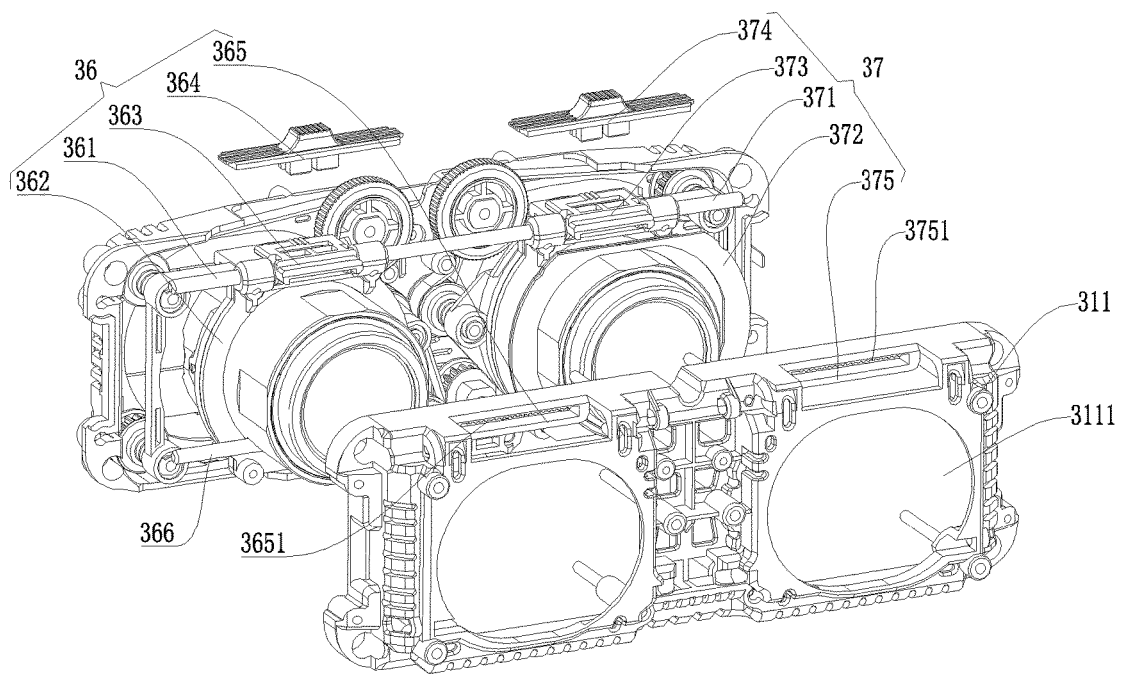
FIG. 15 is a structural decomposition diagram of the left pupillary distance adjusting mechanism and the right pupillary distance adjusting mechanism in FIG. 9.
Figure 16:
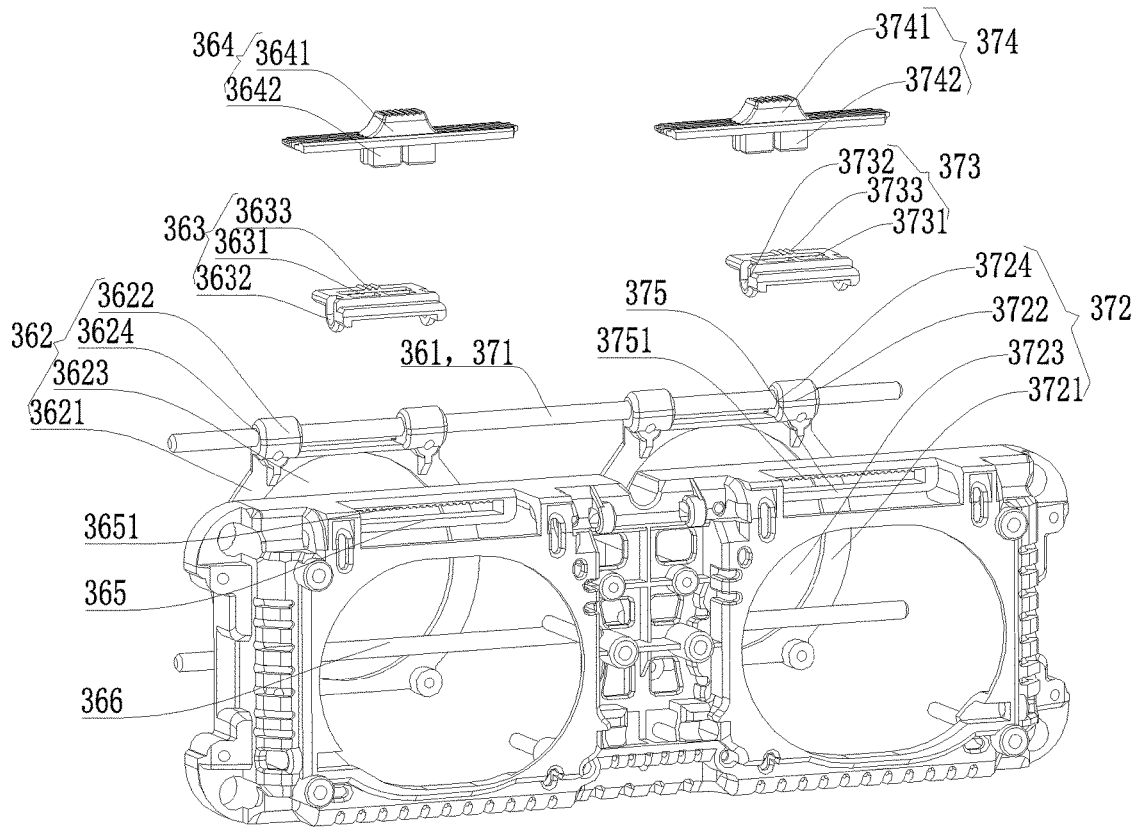
FIG. 16 is an another structural decomposition diagram of the left pupillary distance adjusting mechanism and the right pupillary distance adjusting mechanism in FIG. 9.

As shown in FIGS. 15 and 16, the left pupillary distance adjusting mechanism 36 includes a left pupillary distance guide shaft 361, a left lens barrel connecting piece 362, a left pushing piece 363, and a left push button 364 that are matched with each other. Wherein the left pupillary distance guide shaft 361 is disposed on the module housing 31, in this embodiment, the left pupillary distance guide shaft 361 is disposed on the module front housing 311.The module front housing 311 is provided with a pupillary distance limit hole 3111 for the left lens barrel assembly 321 to pass through to limit the pupillary distance adjustment range of the left eye. The left lens barrel connecting piece 362 is arranged on the left pupillary distance guide shaft 361 and can move along the left pupillary distance guide shaft 361, and is connected with the left lens barrel assembly 321, so that the left lens barrel assembly 321 can be driven to move when the left lens barrel connecting piece 362 moves, thereby realizing the purpose of separately controlling the left lens barrel assembly 321 to move left and right to adjust the left pupillary distance. The left pushing piece 363 is provided on the left pupillary distance guide shaft 361 and can move along the left pupillary distance guide shaft 361, and can drive the left lens barrel connecting piece 362 to move along the left pupillary distance guide shaft 361.The left push button 364 is provided on the left pushing piece 363 for controlling the left pushing piece 363 to move along the left pupillary distance guide shaft 361. In use, user can push the left push button 364 to move left and right with hand, so that the left pushing piece 363 connected to the left push button 364 moves along left and right, and drives the left lens barrel connecting piece 362 and the left lens barrel assembly 321 to move, to realize pupillary distance adjustment for the left eye.

As shown in FIG. 16, the left lens barrel connecting piece 362 includes an integrally-formed left lens barrel connecting part 3621 and left guide shaft connecting part 3622, wherein the left lens barrel connecting part 3621 is provided with a left lens barrel through hole 3623 for the left lens barrel assembly 321 to pass through, and the left guide shaft connecting part 3622 is provided with a left guide through hole 3624 for the left pupillary distance guide shaft 361 to pass through. The left push button 364 includes an integrally-formed left pushing part 3641 and left extension convex part 3642. The left pushing piece 363 is provided with a left groove 3631 matched with the left extension convex part 3642 and a left pushing insertion hole 3632 for the left pupillary distance guide shaft 361 to pass through. In the assembly process of the left pupillary distance adjusting mechanism 36, the left extension convex part 3642 on the left push button 364 can be inserted into the left groove 3631 of the left pushing piece 363, and the left lens barrel through hole 3623 of the left lens barrel connecting piece 362 and the left pushing insertion hole 3632 of the left pushing piece 363 are in a straight line, the left pupillary distance guide shaft 361 is passed through the left lens barrel through hole 3623 and the left pushing insertion hole 3632, and then the left pupillary distance guide shaft 361 is mounted on the module housing 31, so that the assembly is completed.

Specifically, there are two left guide through holes 3624 on the left lens barrel connecting piece 362, and one left pushing insertion hole 3632 on the left pushing piece 363, when they are matched with the left pupillary distance guide shaft 361, one left pushing insertion hole 3632 is disposed between the two left guide through holes 3624, so that the left pushing piece 363 can drive the left lens barrel connecting piece 362 to move when it moves. Alternatively, there are one left guide through hole 3624 on the left lens barrel connecting piece 362, and two left pushing insertion holes 3632 on the left pushing piece 363, when they are matched with the left pupillary distance guide shaft 361, the left guide through hole 3624 is disposed between the two left pushing insertion holes 3632, so that the left pushing piece 363 can drive the left lens barrel connecting piece 362 to move when it moves.

Specifically, the left pupillary distance adjusting mechanism 36 further includes a left push limiting assembly (not shown) disposed inside the left pushing piece 363 and the module housing 31. In this embodiment, the left pushing piece 363 is disposed inside the module front housing 311, and is used to limit the move distance of the left pushing piece 363 each time when the left push button 364 pushes the left pushing piece 363 to move left and right, so that the left pupillary distance adjustment is more accurate.

Specifically, the left push limiting assembly includes a left pupillary distance sliding limiting piece 365 arranged inside the module housing 31. The left pupillary distance sliding limiting piece 365 matches with the module housing 31 to form a left sliding space into which the left pushing piece 363 is inserted. When the left pupillary distance adjusting mechanism 36 is assembled, the left pushing piece 363 needs to be inserted into the left sliding space. The left pupillary distance sliding limiting piece 365 inside the sliding space or one side of the module housing 31 is provided with a left sliding gear rack 3651. Correspondingly, the part of the left pushing piece 363 inserted into the left sliding space is provided with a left pushing gear 3633 matched with the left sliding gear rack 3651. In the process of pushing the left pushing piece 363 to move left and right by the left push button 364, the left pushing gear 3633 is matched with the left sliding gear rack 3651, so as to accurately adjust the distance that the left pushing piece 363 moves along the left pupillary distance guide shaft 361, realizing accurate adjustment of the pupillary distance of the left eye. In this embodiment, the left pupillary distance sliding limiting piece 365 is disposed inside the module front housing 311.

As shown in FIGS. 15 and 16, the right pupillary distance adjusting mechanism 37 includes a right pupillary distance guide shaft 371, a right lens barrel connecting piece 372, a right pushing piece 373, and a right push button 374 that are matched with each other. Wherein the right pupillary distance guide shaft 371 is disposed on the module housing 31, in this embodiment, the right pupillary distance guide shaft 371 is disposed on the module front housing 311.The module front housing 311 is provided with a pupillary distance limit hole 3111 for the right lens barrel assembly 331 to pass through to limit the pupillary distance adjustment range of the right eye. The right lens barrel connecting piece 372 is arranged on the right pupillary distance guide shaft 371 and can move along the right pupillary distance guide shaft 371, and is connected with the right lens barrel assembly 331, so that the right lens barrel assembly 331 can be driven to move when the right lens barrel connecting piece 372 moves, thereby realizing the purpose of separately controlling the right lens barrel assembly 331 to move right and right to adjust the right pupillary distance. The right pushing piece 373 is provided on the right pupillary distance guide shaft 371 and can move along the right pupillary distance guide shaft 371, and can drive the right lens barrel connecting piece 372 to move along the right pupillary distance guide shaft 371. The right push button 374 is provided on the right pushing piece 373 for controlling the right pushing piece 373 to move along the right pupillary distance guide shaft 371. In use, user can push the right push button 374 to move right and right with hand, so that the right pushing piece 373 connected to the right push button 374 moves along right and right, and drives the right lens barrel connecting piece 372 and the right lens barrel assembly 331 to move, to realize pupillary distance adjustment for the right eye.

As shown in FIG. 16, the right lens barrel connecting piece 372 includes an integrally-formed right lens barrel connecting part 3721 and right guide shaft connecting part 3722, the right lens barrel connecting part 3721 is provided with a right lens barrel through hole 3723 for the right lens barrel assembly 331 to pass through, and the right guide shaft connecting part 3722 is provided with a right guide through hole 3724 for the right pupillary distance guide shaft 371 to pass through. The right push button 374 includes an integrally-formed right pushing part 3741 and right extension convex part 3742. The right pushing piece 373 is provided with a right groove 3731 matched with the right extension convex part 3742 and a right pushing insertion hole 3732 for the right pupillary distance guide shaft 371 to pass through. In the assembly process of the right pupillary distance adjusting mechanism 37, the right extension convex part 3742 on the right push button 374 can be inserted into the right groove 3731 of the right pushing piece 373, and the right lens barrel through hole 3723 of the right lens barrel connecting piece 372 and the right pushing insertion hole 3732 of the right pushing piece 373 are in a straight line, the right pupillary distance guide shaft 371 is passed through the right lens barrel through hole 3723 and the right pushing insertion hole 3732, and then the right pupillary distance guide shaft 371 is mounted on the module housing 31, so that the assembly is completed.

Specifically, there are two right guide through holes 3724 on the right lens barrel connecting piece 372, and one right pushing insertion hole 3732 on the right pushing piece 373, when they are matched with the right pupillary distance guide shaft 371, one right pushing insertion hole 3732 is disposed between the two right guide through holes 3724, so that the right pushing piece 373 can drive the right lens barrel connecting piece 372 to move when it moves. Alternatively, there are one right guide through hole 3724 on the right lens barrel connecting piece 372, and two right pushing insertion holes 3732 on the right pushing piece 373, when they are matched with the right pupillary distance guide shaft 371, the right guide through hole 3724 is disposed between the two right pushing insertion holes 3732, so that the right pushing piece 373 can drive the right lens barrel connecting piece 372 to move when it moves.

Specifically, the right pupillary distance adjusting mechanism 37 further includes a right push limiting assembly (not shown) disposed inside the right pushing piece 373 and the module housing 31. In this embodiment, the right pushing piece 373 is disposed inside the module front housing 311, and is used to limit the move distance of the right pushing piece 373 each time when the right push button 374 pushes the right pushing piece 373 to move right and right, so that the right pupillary distance adjustment is more accurate.

Specifically, the right push limiting assembly includes a right pupillary distance sliding limiting piece 375 arranged inside the module housing 31. The right pupillary distance sliding limiting piece 375 matches with the module housing 31 to form a right sliding space into which the right pushing piece 373 is inserted. When the right pupillary distance adjusting mechanism 37 is assembled, the right pushing piece 373 needs to be inserted into the right sliding space. The right pupillary distance sliding limiting piece 375 inside the sliding space or one side of the module housing 31 is provided with a right sliding gear rack 3751. Correspondingly, the part of the right pushing piece 373 inserted into the right sliding space is provided with a right pushing gear 3733 matched with the right sliding gear rack 3751. In the process of pushing the right pushing piece 373 to move right and right by the right push button 374, the right pushing gear 3733 is matched with the right sliding gear rack 3751, so as to accurately adjust the distance that the right pushing piece 373 moves along the right pupillary distance guide shaft 371, realizing accurate adjustment of the pupillary distance of the right eye. In this embodiment, the right pupillary distance sliding limiting piece 375 is disposed inside the module front housing 311.

The left pupillary distance guide shaft 361 and the right pupillary distance guide shaft 371 in this embodiment may be the same metal guide shaft that passes through the module front housing 311, the left lens barrel connecting piece 362, the left pushing piece 363, the right lens barrel connecting piece 372 and the right pushing piece 373, which is beneficial to ensuring that the left pupillary distance adjustment and the right pupillary distance adjustment are in a straight line, and can save the assembly time of the left pupillary distance guide shaft 361 and the right pupillary distance guide shaft 371.

Further, the optical module 3 includes a metal guide limit shaft 366 disposed on the module housing 31 and passing through the left lens barrel housing 3211 and the right lens barrel housing 3311; The metal guide limit shaft 366 is parallel to the left pupillary distance guide shaft 361 and the right pupillary distance guide shaft 371. The left pupillary distance guide shaft 361, the right pupillary distance guide shaft 371 and the metal guide limit shaft 366 are made of metal materials with high hardness, high precision and strong resistance to friction, which can ensure the degree of balance and parallelism and avoid deformation in the process of pupillary distance adjustment.

In the optical module 3 provided in this embodiment, since the left display screen 3221 and the right display screen 3321 are respectively arranged behind the left lens barrel assembly 321 and the right lens barrel assembly 331, when the left lens barrel assembly 321 and the right lens barrel assembly 331 are respectively controlled to move left and right by the left pupillary distance adjusting mechanism 36 and the right pupillary distance adjusting mechanism 37, the pupillary distance of left eye and right eye can be separately controlled, so that users can freely adjust the pupillary distance of left eye or right eye according to the pupillary distance of his own eyes, and the images seen by both eyes through the left lens barrel assembly 321 and the right lens barrel assembly 331 are clearer; It can prevent the optical centers of the left lens barrel assembly 321 and the right lens barrel assembly 331 from changing relative to the display centers of the left display screen 3221 and the right display screen 3321, respectively, thereby effectively ensuring the display effect of images in the left lens barrel assembly 321 and the right lens barrel assembly 331.

The present invention has been described through several specific embodiments, and it shall be understood by those skilled in the art that various changes and equivalent substitutions can be made to the present invention without departing from the scope of the present invention. In addition, various modifications may be made to the present invention according to a specific situation or a particular circumstance without departing from the scope of the present invention. Therefore, the present invention is not limited to the specific embodiments disclosed, but shall include all embodiments falling within the scope of the claims of the present invention.

What is claimed is:

1. A head-mounted display apparatus, comprising a headband module and a head-mounted display module connected with the headband module, wherein the head-mounted display module comprises a head-mounted display housing, and an optical module disposed within the head-mounted display housing, is characterized in that the headband module comprises a connecting structure connected with the head-mounted display housing so as to adjust a wearing angle of the head-mounted display module; the optical module comprises a module housing, a left lens barrel mechanism, a right lens barrel mechanism, a left sight distance adjusting mechanism, a right sight distance adjusting mechanism, a left pupillary distance adjusting mechanism and a right pupillary distance adjusting mechanism which are arranged in the module housing; the left lens barrel mechanism comprises a left lens barrel assembly and a left display screen assembly sleeved behind the left lens barrel assembly, wherein the left display screen assembly comprises a left display screen and a left screen bracket for mounting the left display screen; the right lens barrel mechanism comprises a right lens barrel assembly and a right display screen assembly sleeved behind the right lens barrel assembly, wherein the right display screen assembly comprises a right display screen and a right screen bracket for mounting the right display screen; the left sight distance adjusting mechanism is arranged inside the module housing and connected with the left display screen assembly for adjusting the distance between the left display screen and the left lens barrel assembly; the right sight distance adjusting mechanism is arranged inside the module housing and connected with the right display screen assembly for adjusting the distance between the right display screen and the right lens barrel assembly; the left pupillary distance adjusting mechanism is connected with the left lens barrel mechanism for driving the left lens barrel mechanism to move left and right; the right pupillary distance adjusting mechanism is connected with the right lens barrel mechanism for driving the right lens barrel mechanism to move left and right;

wherein the left sight distance adjustment mechanism comprises a left adjustment button, a left driven synchronous gear, a first left synchronous screw, a second left synchronous screw, a third left synchronous screw, a left tension wheel, a left synchronous belt and a left sight distance pushing bracket; the left sight distance pushing bracket is connected with the left screen bracket; the left sight distance pushing bracket is arranged on the first left synchronous screw, the second left synchronous screw and the third left synchronous screw; the left adjustment button, left driven synchronous gear, first left synchronous screw, second left synchronous screw, third left synchronous screw, left tension wheel and the left synchronous belt are matched, so that the left sight distance pushing bracket drives the left screen bracket to move back and forth;

the right sight distance adjustment mechanism comprises a right adjustment button, a right driven synchronous gear, a first right synchronous screw, a second right synchronous screw, a third right synchronous screw, a right tension wheel, a right synchronous belt and a right sight distance pushing bracket; the right sight distance pushing bracket is connected with the right screen bracket; the right sight distance pushing bracket is arranged on the first right synchronous screw, the second right synchronous screw and the third right synchronous screw; the right adjustment button, right driven synchronous gear, first right synchronous screw, second right synchronous screw, third right synchronous screw, right tension wheel and the right synchronous belt are matched, so that the right sight distance pushing bracket drives the right screen bracket to move back and forth;

wherein the module housing comprises a module front housing and a module rear housing, the module front housing is provided with a plurality of metal mounting shafts; the left adjustment button, left driven synchronous gear, first left synchronous screw, second left synchronous screw, third left synchronous screw, left tension wheel, left synchronous belt and left sight distance pushing bracket are arranged on the metal mounting shaft; the right adjustment button, right driven synchronous gear, first right synchronous screw, second right synchronous screw, third right synchronous screw, right tension wheel, right synchronous belt and right sight distance pushing bracket are arranged on the metal mounting shaft.

2. The head-mounted display apparatus according to claim 1, wherein the left adjustment button comprises a left rotation control and a left driving gear which are integrally formed; the first left synchronous screw comprises a first left driven gear and a first left screw which are integrally formed; the second left synchronous screw comprises a second left driven gear and a second left screw which are integrally formed; the third left synchronous screw comprises a third left driven gear and a third left screw which are integrally formed; the left sight distance pushing bracket comprises a left bracket body, a first left screw hole, a second left screw hole, a third left screw hole and a left bracket connecting part arranged on the left bracket body; the left driving gear, left tension wheel, left driven synchronous gear, first left driven gear, second left driven gear and the third left driven gear are matched with the left synchronous belt to realize synchronous transmission; the first left screw is matched with the first left screw hole, the second left screw is matched with the second left screw hole, and the third left screw is matched with the third left screw hole, so as to move the left bracket body back and forth;

the right adjustment button comprises a right rotation control and a right driving gear which are integrally formed; the first right synchronous screw comprises a first right driven gear and a first right screw which are integrally formed; the second right synchronous screw comprises a second right driven gear and a second right screw which are integrally formed; the third right synchronous screw comprises a third right driven gear and a third right screw which are integrally formed; the right sight distance pushing bracket comprises a right bracket body, a first right screw hole, a second right screw hole, a third right screw hole and a right bracket connecting part arranged on the right bracket body; the right driving gear, right tension wheel, right driven synchronous gear, first right driven gear, second right driven gear and the third right driven gear are matched with the right synchronous belt to realize synchronous transmission; the first right screw is matched with the first right screw hole, the second right screw is matched with the second right screw hole, and the third right screw is matched with the third right screw hole, so as to move the right bracket body back and forth.

3. The head-mounted display apparatus according to claim 1, wherein the left lens barrel assembly comprises a left lens barrel housing and a left lens assembly arranged in the left lens barrel housing, and the left lens barrel housing is provided with at least one left connecting hole; the left screen bracket is provided with at least one left sliding groove arranged along the front-back direction; the left lens barrel mechanism also comprises a left connecting pin which passes through the left sliding groove and is installed on the left connecting hole;

the right lens barrel assembly comprises a right lens barrel housing and a right lens assembly arranged in the right lens barrel housing, and the right lens barrel housing is provided with at least one right connecting hole; the right screen bracket is provided with at least one right sliding groove arranged along the front-back direction; the right lens barrel mechanism also comprises a right connecting pin which passes through the right sliding groove and is installed on the right connecting hole.

4. The head-mounted display apparatus according to claim 1, wherein the left pupillary distance adjusting mechanism comprises a left pupillary distance guide shaft, a left lens barrel connecting piece, a left pushing piece and a left push button; the left pupillary distance guide shaft is installed on the module housing; the left lens barrel connecting piece is arranged on the left pupillary distance guide shaft and connected with the left lens barrel assembly; the left pushing piece is arranged on the left pupillary distance guide shaft and drives the left lens barrel connecting piece to move along the left pupillary distance guide shaft; the left push button is arranged on the left pushing piece and is used for controlling the left pushing piece to move along the left pupillary distance guide shaft;

the right pupillary distance adjusting mechanism comprises a right pupillary distance guide shaft, a right lens barrel connecting piece, a right pushing piece and a right push button; the right pupillary distance guide shaft is installed on the module housing; the right lens barrel connecting piece is arranged on the right pupillary distance guide shaft and connected with the right lens barrel assembly; the right pushing piece is arranged on the right pupillary distance guide shaft and drives the right lens barrel connecting piece to move along the right pupillary distance guide shaft; the right push button is arranged on the right pushing piece and is used for controlling the right pushing piece to move along the right pupillary distance guide shaft.

5. The head-mounted display apparatus according to claim 4, characterized in that the left lens barrel connecting piece comprises a left lens barrel connecting part and a left guide shaft connecting part which are integrally formed, the left lens barrel connecting part is provided with a left guide hole for the left lens barrel assembly to pass through, and the left guide shaft connecting part is provided with a left guide hole for the left pupillary distance guide shaft to pass through; the left push button comprises a left pushing part and left extension convex parts which are integrally formed; the left pushing piece is provided with a left groove matched with the left extension convex parts, and a left pushing insertion hole for the left pupillary distance guide shaft to pass through;

the right lens barrel connecting piece comprises a right lens barrel connecting part and a right guide shaft connecting part which are integrally formed, the right lens barrel connecting part is provided with a right guide hole for the right lens barrel assembly to pass through, and the right guide shaft connecting part is provided with a right guide hole for the right pupillary distance guide shaft to pass through; the right push button comprises a right pushing part and right extension convex parts which are integrally formed; the right pushing piece is provided with a right groove matched with the right extension convex parts, and a right pushing insertion hole for the right pupillary distance guide shaft to pass through.

6. The head-mounted display apparatus according to claim 5, wherein the left pupillary distance adjusting mechanism further comprises a left push limiting assembly; the left push limiting assembly comprises a left pupillary distance sliding limiting piece arranged inside the module housing, and the left pupillary distance sliding limiting piece is matched with the module housing to form a left sliding space for the left pushing piece to be inserted; the left pupillary distance sliding limiting piece on the inner side of the sliding space or one side of the module housing is provided with a left sliding gear rack; the part of the left sliding space where the left pushing piece inserted is provided with a left pushing rack matched with the left sliding gear rack;

the right pupillary distance adjusting mechanism further comprises a right push limiting assembly; the right push limiting assembly comprises a right pupillary distance sliding limiting piece arranged inside the module housing, and the right pupillary distance sliding limiting piece is matched with the module housing to form a right sliding space for the right pushing piece to be inserted; the right pupillary distance sliding limiting piece on the inner side of the sliding space or one side of the module housing is provided with a right sliding gear rack; the part of the right sliding space where the right pushing piece inserted is provided with a right pushing rack matched with the right sliding gear rack.

7. The head-mounted display apparatus according to claim 1, wherein the headband module comprises a headband body, a front housing, a rear housing, an elastic adjustment component, a control locking component and a connecting structure; the front housing and the rear housing are matched to form an accommodating space; the elastic adjusting component is arranged in the accommodating space and connected with the headband body for adjusting tightness of the headband body; the control locking component is arranged in the accommodating space and extends out of the front housing and the rear housing, and is connected with the elastic adjustment component for controlling the elastic adjustment component to adjust the tightness of the headband body;

the connecting structure comprises a first rotating shaft connecting piece, a second rotating shaft connecting piece and a third rotating shaft connecting piece; the first rotating shaft connecting piece and the second rotating shaft connecting piece, the second rotating shaft connecting piece and the third rotating shaft connecting piece are respectively rotatably connected through a rotating shaft connecting assembly; one end of the first rotating shaft connecting piece extends into the accommodating space and is fixedly connected with the head-mounted front housing or the rear housing.

8. The head-mounted display apparatus according to claim 7, wherein the elastic adjustment component comprises a positioning column disposed inside the head-mounted rear housing and in contact with the rear housing, a first headband connector and a second headband connector respectively disposed at both ends of the headband body, and a gear piece sleeved on the positioning column; the first headband connector and the second headband connector are sleeved on the positioning column and move towards or away from each other under the drive of the gear piece;

the control locking component comprises a limit latch arranged on the head-mounted front housing, a locking adjustment button sleeved on the positioning column, and the gear piece; the gear piece comprises the gear part and a gripper integrally formed with the gear part; the gear part is meshed with the first rack and the second rack through the locking adjustment button; the gripper is matched with the locking adjustment button and the limit latch to control the elastic adjustment component to adjust the tightness of the headband body.

9. The head-mounted display apparatus according to claim 7, wherein the rotating shaft connecting assembly comprises two first connecting holes oppositely arranged on the second rotating shaft connecting piece, a second connecting hole arranged on the first rotating shaft connecting piece or the third rotating shaft connecting piece, and a rotating shaft for connecting the two first connecting holes and the second connecting hole; the second connecting hole is positioned between the two first connecting holes, and a damping structure is arranged between the second connecting hole and the rotating shaft;

the rotating shaft comprises two first metal rotating shafts, wherein the first metal rotating shaft comprises a bearing portion, a fastening part disposed at one end of the bearing portion, and a rotating part sleeved on the bearing portion; the damping structure is arranged between the rotating part and the bearing portion; the fastening part is disposed in the first connecting hole and interference fit with the first connecting hole, and the rotating part is disposed in the second connecting hole and interference fit with the second connecting hole;
   or, the rotating shaft comprises a second metal rotating shaft, wherein the second metal rotating shaft comprises a bearing portion, two fastening parts disposed at two ends of the bearing portion, and a rotating part sleeved on the bearing portion; the damping structure is arranged between the rotating part and the bearing portion; the fastening part is disposed in the first connecting hole and interference fit with the first connecting hole, and the rotating part is disposed in the second connecting hole and interference fit with the second connecting hole.

* * * * *